US012720935B2

(12) United States Patent
Lee et al.

(10) Patent No.: US 12,720,935 B2
(45) Date of Patent: Aug. 25, 2026

(54) DISPLAY DEVICE AND METHOD OF MANUFACTURING THE SAME

(71) Applicant: Samsung Display Co., LTD., Yongin-si (KR)

(72) Inventors: Won Jun Lee, Yongin-si (KR); Dong Woo Kim, Yongin-si (KR); Do Yeong Park, Yongin-si (KR); Se Hyun Lee, Yongin-si (KR); Kwi Hyun Kim, Yongin-si (KR); Min Gyeong Shin, Yongin-si (KR); Jin Joo Ha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 345 days.

(21) Appl. No.: 18/364,339

(22) Filed: Aug. 2, 2023

(65) Prior Publication Data

US 2024/0072228 A1 Feb. 29, 2024

(30) Foreign Application Priority Data

Aug. 24, 2022 (KR) ........................ 10-2022-0106410

(51) Int. Cl.
*H10H 20/857* (2025.01)
*H10H 20/85* (2025.01)
(Continued)

(52) U.S. Cl.
CPC ...... *H10H 20/857* (2025.01); *H10H 20/8506* (2025.01); *H10W 90/00* (2026.01); *H10H 20/0364* (2025.01)

(58) Field of Classification Search
CPC ............. H10H 20/857; H10H 20/8506; H10H 20/0364; H01L 25/167
(Continued)

(56) References Cited

U.S. PATENT DOCUMENTS 10,580,946 B2 3/2020 Im et al.
10,797,212 B2 10/2020 Im et al.
(Continued)

FOREIGN PATENT DOCUMENTS

KR 10-2020-0088962 A 7/2020
KR 10-2021-0103602 A 8/2021
(Continued)

OTHER PUBLICATIONS

K-PION Patent Search (Year: 2026).*

*Primary Examiner* — James R Greece
*Assistant Examiner* — Hana S Featherly
(74) *Attorney, Agent, or Firm* — Womble Bond Dickinson (US) LLP

(57) ABSTRACT

A display device comprises a first pixel including a first emission area, a second pixel including a second emission area spaced apart from the first emission area in a first direction, and a bank partitioning the first emission area and the second emission area, wherein the first pixel includes a first alignment electrode, a second alignment electrode, and a third alignment electrode sequentially located, spaced apart from each other in the first direction, and overlapping with the first emission area, first light-emitting elements above, and overlapping with, the first alignment electrode and the second alignment electrode, second light-emitting elements above, and overlapping with, the second alignment electrode and the third alignment electrode, and a dummy electrode between the first emission area and the second emission area, and overlapping with the bank.

20 Claims, 20 Drawing Sheets

(51) Int. Cl.
*H10W 90/00* (2026.01)
*H10H 20/01* (2025.01)

(58) Field of Classification Search
USPC .......................................................... 313/500
See application file for complete search history.

(56) References Cited

U.S. PATENT DOCUMENTS

| | | | | |
|---|---|---|---|---|
| 11,088,197 | B2 | 8/2021 | Kang et al. | |
| 11,967,607 | B2 | 4/2024 | Do et al. | |
| 12,218,177 | B2 | 2/2025 | Lee et al. | |
| 2021/0143137 | A1* | 5/2021 | Kim | H10D 86/021 |
| 2021/0336088 | A1 | 10/2021 | Park et al. | |
| 2021/0384179 | A1 | 12/2021 | Bok et al. | |

FOREIGN PATENT DOCUMENTS

| | | | |
|---|---|---|---|
| KR | 10-2021-0132786 | A | 11/2021 |
| KR | 10-2021-0153174 | A | 12/2021 |
| KR | 10-2022-0117415 | A | 8/2022 |

* cited by examiner

FIG. 6B

PXL1
PXL2
PXL3
CNT6
CNT5
LD1
LD2
PE1
PE2
CNE
BNK(NEA)
DR1
DR2

NEA
EMA1
NEA
EMA2
NEA
CF3
CF2
CF1
CF
CAP2
LRL
CAP1
CCL
BNK
INS1
VIA
PSV
ILD
GI
BFL
SUB
I'
I
DME1 (or DME2)
OC
WCP
INS3
INS2
INS4
ALE1
INP1
PE1
LD1
ALE2
INP2
CNE
LD2
PE2
INP3
ALE3
TE1
SE
GE
ACT
DE
TE2
T1
BML
CFL
OPL
DPL
PCL
DR1
DR2
DR3

FIG. 11

SUB
PXL3 CNT3 CNT2 CNT1 ALE3 ALE2 ALE1
PXL2 CNT3 CNT2 CNT1 ALE3 ALE2 ALE1
PXL1 CNT3 CNT2 CNT1 ALE3 ALE2 ALE1
DR1 DR2

FIG. 12

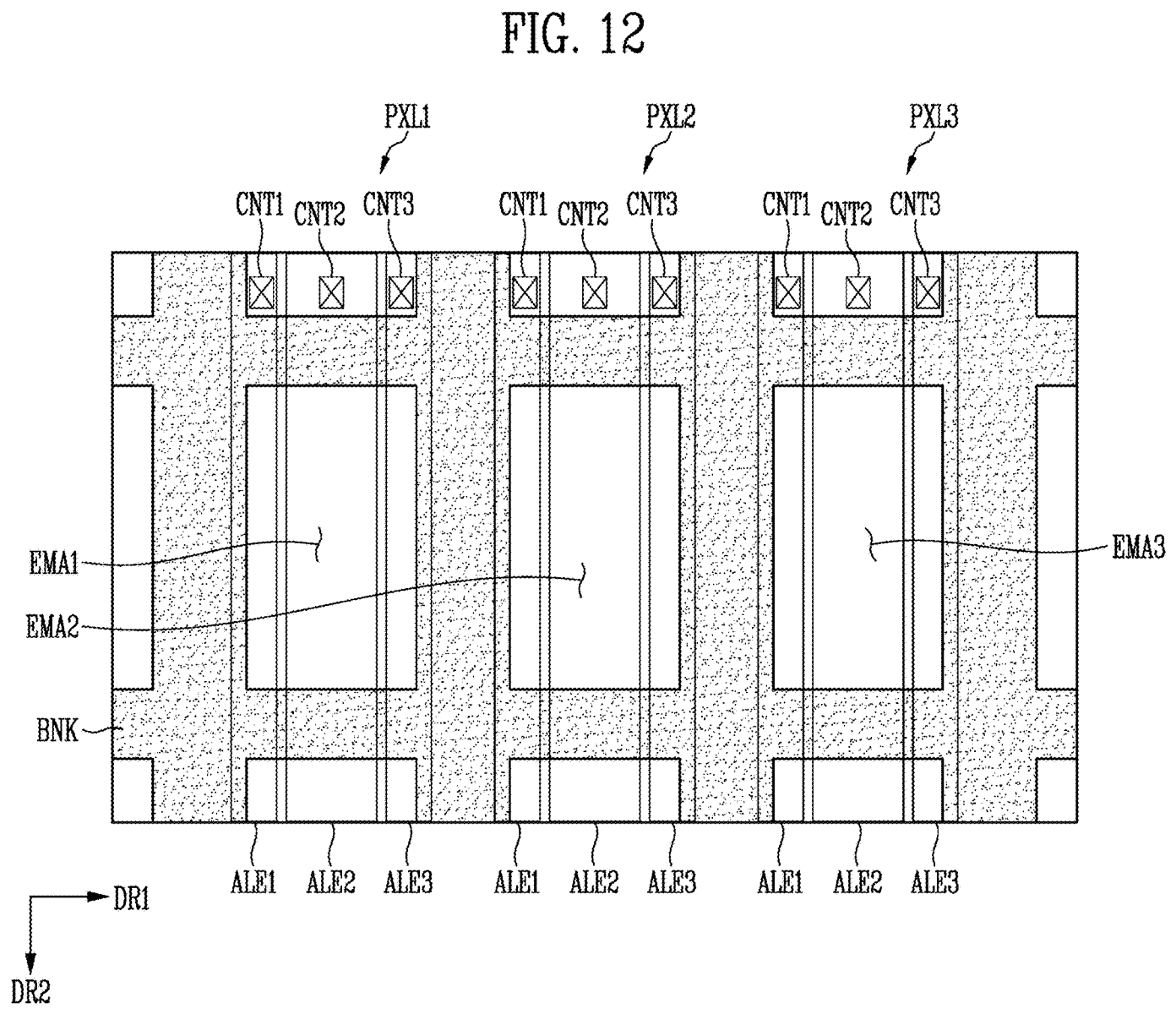

EMA3
PXL3
CNT3
CNT2
CNT1
ALE3
ALE2
ALE1
PXL2
CNT3
CNT2
CNT1
ALE3
ALE2
ALE1
PXL1
CNT3
CNT2
CNT1
ALE3
ALE2
ALE1
EMA1
EMA2
BNK
DR1
DR2

FIG. 13A

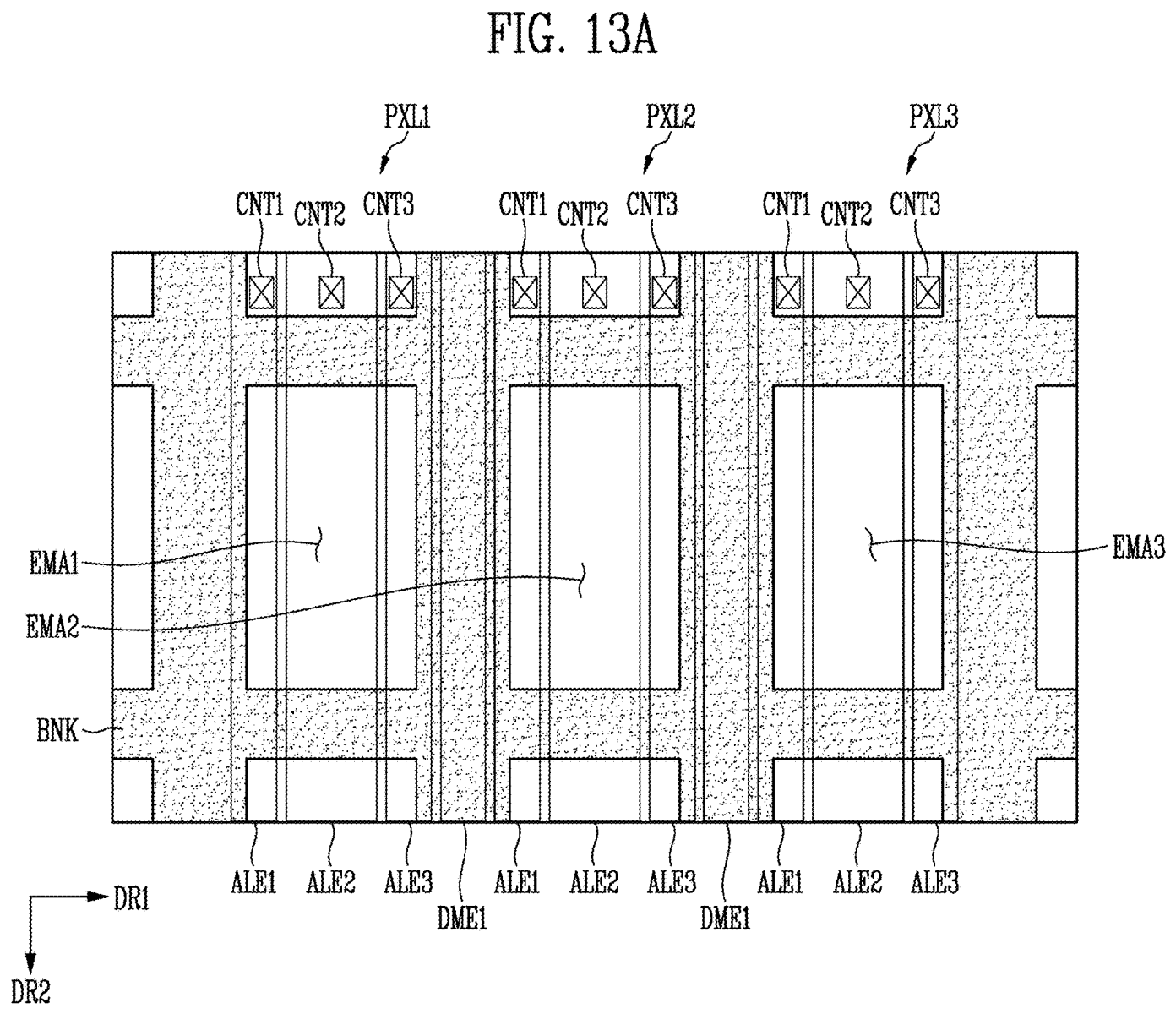

PXL3 CNT3 CNT2 CNT1 EMA3 ALE3 ALE2 ALE1 DME1
PXL2 CNT3 CNT2 CNT1 ALE3 ALE2 ALE1 DME1
PXL1 CNT3 CNT2 CNT1 ALE3 ALE2 ALE1
EMA1 EMA2 BNK DR1 DR2

FIG. 13B

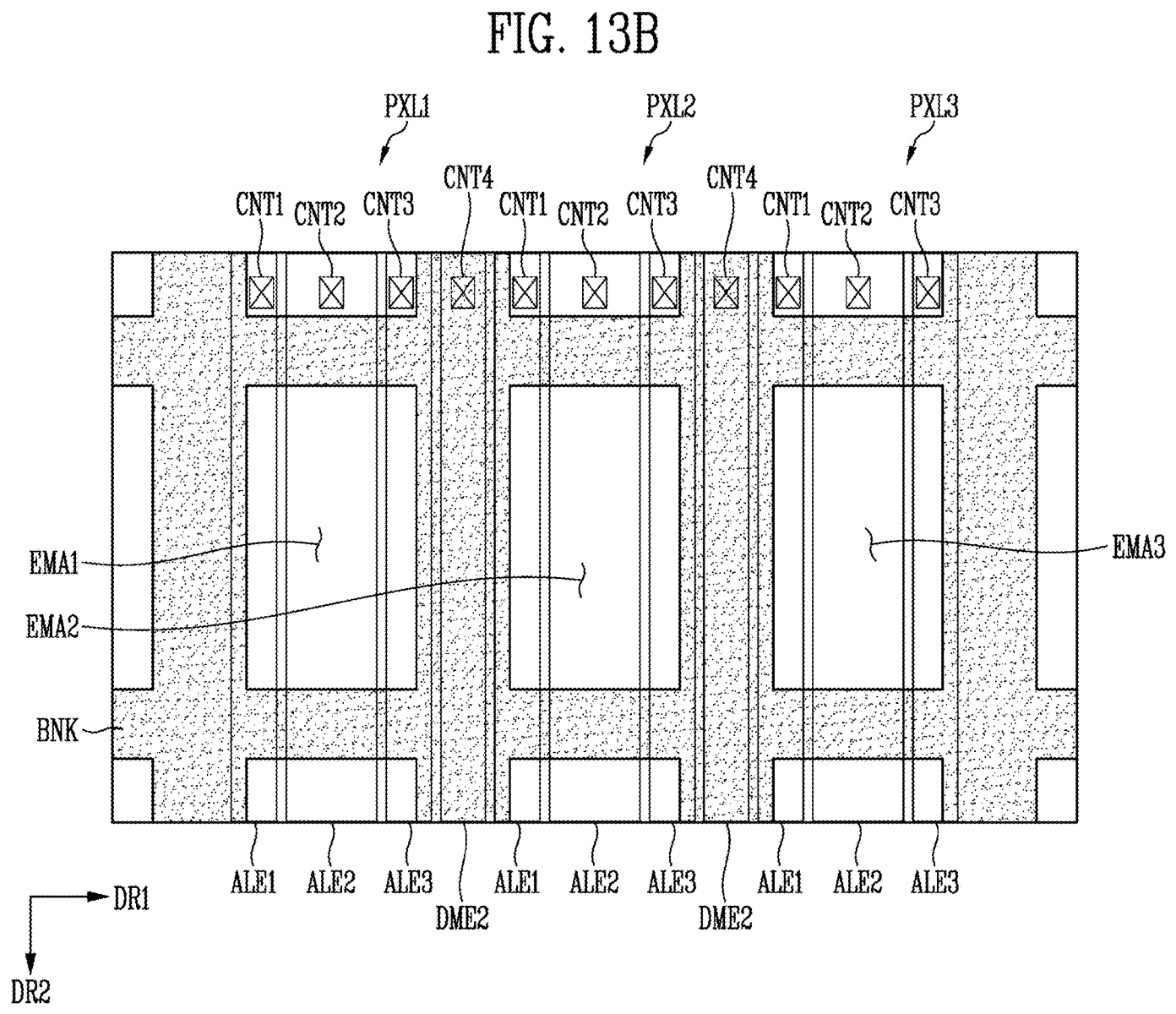

EMA3
PXL3
CNT3
CNT2
CNT1
CNT4
PXL2
CNT3
CNT2
CNT1
CNT4
PXL1
CNT3
CNT2
CNT1
ALE3
ALE2
ALE1
DME2
ALE3
ALE2
ALE1
DME2
ALE3
ALE2
ALE1
EMA1
EMA2
BNK
DR1
DR2

DISPLAY DEVICE AND METHOD OF MANUFACTURING THE SAME

CROSS-REFERENCE TO RELATED APPLICATION

The application claims priority to, and the benefit of, Korean patent application No. 10-2022-0106410 filed on Aug. 24, 2022, in the Korean Intellectual Property Office, the entire disclosure of which is incorporated herein by reference.

BACKGROUND

1. Field

The present disclosure generally relates to a display device and a method of manufacturing the same.

2. Description of the Related Art

Recently, as interest in information displays is increased, research and development of display devices have been continuously conducted.

SUMMARY

Embodiments provide a display device including a dummy electrode that is located between emission areas of pixels and overlaps with a bank.

Embodiments also provide a method of manufacturing a display device, in which light-emitting elements are arranged by applying an alignment signal to alignment electrodes in a state in which a dummy electrode is located, which is located between emission areas of pixels and overlaps with a bank.

In accordance with an aspect of the present disclosure, there is provided a display device including a first pixel including a first emission area, a second pixel including a second emission area spaced apart from the first emission area in a first direction, and a bank partitioning the first emission area and the second emission area, wherein the first pixel includes a first alignment electrode, a second alignment electrode, and a third alignment electrode sequentially located, spaced apart from each other in the first direction, and overlapping with the first emission area, first light-emitting elements above, and overlapping with, the first alignment electrode and the second alignment electrode, second light-emitting elements above, and overlapping with, the second alignment electrode and the third alignment electrode, and a dummy electrode between the first emission area and the second emission area, and overlapping with the bank.

The first alignment electrode and the third alignment electrode may be configured to provide a first alignment signal while the second alignment electrode is configured to provide a second alignment signal that is different from the first alignment signal.

The dummy electrode may be configured to provide the first alignment signal.

The dummy electrode may include a floating electrode.

A planar shape of the first alignment electrode may be substantially the same as a planar shape of the third alignment electrode.

A width of each of the first alignment electrode and the third alignment electrode in the first direction may be less than a width of the second alignment electrode in the first direction.

The width of the second alignment electrode in the first direction may be twice the width of each of the first alignment electrode and the third alignment electrode in the first direction.

The second pixel may include a fourth alignment electrode, a fifth alignment electrode, and a sixth alignment electrode sequentially located, spaced apart from each other in the first direction, and overlapping with the second emission area, third light-emitting elements above, and overlapping with, the fourth alignment electrode and the fifth alignment electrode, and fourth light-emitting elements above, and overlapping with, the fifth alignment electrode and the sixth alignment electrode.

The dummy electrode may be between the third alignment electrode of the first pixel and the fourth alignment electrode of the second pixel.

The fourth alignment electrode and the sixth alignment electrode may be configured to provide the first alignment signal while the fifth alignment electrode is configured to provide the second alignment signal.

The dummy electrode may be above the bank.

The dummy electrode might not overlap with the first alignment electrode, the second alignment electrode, and the third alignment electrode.

The display device may further include a first pixel electrode, a connection electrode, and a second pixel electrode sequentially arranged, spaced apart from each other in the first direction, and provided in each of the first emission area and the second emission area.

The first alignment electrode, the second alignment electrode, and the third alignment electrode may include a bar-like shape.

The dummy electrode might not overlap with the first emission area and the second emission area.

In accordance with another aspect of the present disclosure, there is provided a method of manufacturing a display device, the method including forming, above a substrate, a first alignment electrode, a second alignment electrode, and a third alignment electrode spaced apart from each other in a first direction, forming, above the first alignment electrode, the second alignment electrode, and the third alignment electrode, a bank defining a first emission area, and a second emission area spaced apart from the first emission area in the first direction, forming a dummy electrode between the first emission area and the second emission area to overlap with the bank, providing light-emitting elements in the first emission area and the second emission area, and arranging the light-emitting elements by applying a first alignment signal to the first alignment electrode and to the third alignment electrode, and by applying a second alignment signal to the second alignment electrode.

In the arranging of the light-emitting elements, the first alignment signal may be applied to the dummy electrode.

The dummy electrode may include a floating electrode.

A planar shape of the first alignment electrode may be substantially the same as a planar shape of the second alignment electrode, wherein a width of each of the first alignment electrode and the third alignment electrode in the first direction is less than a width of the second alignment electrode in the first direction.

The width of the second alignment electrode in the first direction may be twice the width of each of the first alignment electrode and the third alignment electrode.

BRIEF DESCRIPTION OF THE DRAWINGS

Embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 6A, 6B, and 7 are schematic plan views illustrating an example of the pixels included in the display device shown in FIG. 3.

FIGS. 11, 12, 13A, 13B, 14A, 14B, 15A, and 15B are schematic plan views illustrating a method of manufacturing the display device in accordance with embodiments of the present disclosure.

DETAILED DESCRIPTION

Figure 1:
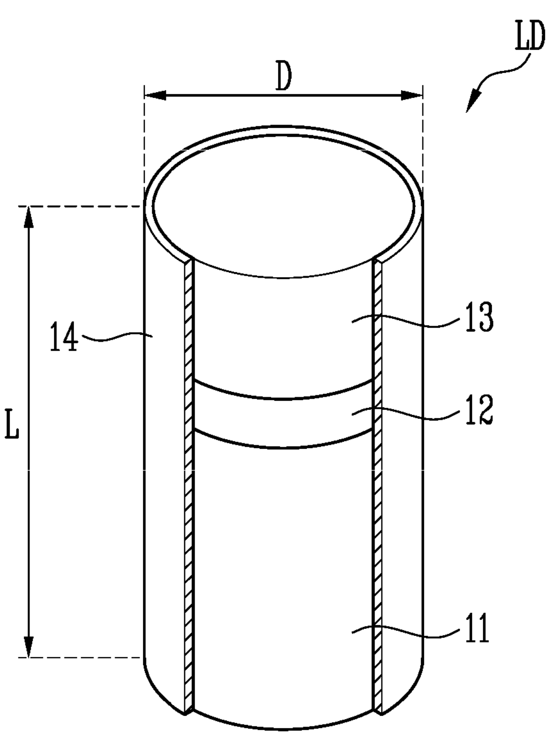
FIG. 1 is a perspective view schematically illustrating a light-emitting element in accordance with embodiments of the present disclosure.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components, such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions, such as "at least one of," or "any one of," when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expression, such as "at least one of A and B" and "at least one of A or B" may include A, B, or A and B. As used herein, "or" generally means "and/or," and the term "and/or" includes any and all combinations of one or more of the associated listed items. For example, the expression, such as "A and/or B" may include A, B, or A and B. Similarly, expressions, such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
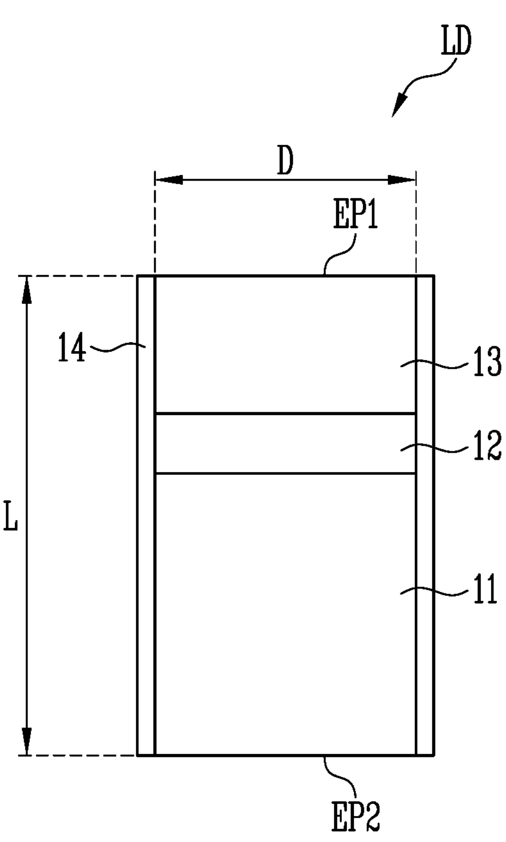
FIG. 2 is a sectional view illustrating an example of the light-emitting element shown in FIG. 1.

FIG. 1 is a perspective view schematically illustrating a light-emitting element in accordance with embodiments of the present disclosure. FIG. 2 is a sectional view illustrating an example of the light-emitting element shown in FIG. 1.

Referring to FIGS. 1 and 2, the light-emitting element LD may include a first semiconductor layer 11, a second semiconductor layer 13, and an active layer 12 interposed between the first and second semiconductor layers 11 and 13. In an example, the light-emitting element LD may be implemented with a light-emitting stack structure (or stack pattern) in which the first semiconductor layer 11, the active layer 12, and the second semiconductor layer 13 are sequentially stacked.

In one or more embodiments, the light-emitting element LD may be provided in a shape extending in one direction. When assuming that an extending direction of the light-emitting element LD is a length direction, the light-emitting element LD may include a first end portion EP1 and a second end portion EP2 along the length direction. One semiconductor layer selected from the first semiconductor layer 11 and the second semiconductor layer 13 may be located at the first end portion EP1 of the light-emitting element LD, and the other semiconductor layer selected from the first semiconductor layer 11 and the second semiconductor layer 13 may be located at the second end portion EP2 of the light-emitting element LD.

In one or more embodiments, the light-emitting element LD may be provided in various shapes. In an example, the light-emitting element LD may have a rod-like shape, a bar-like shape, a pillar-like shape, or the like, which is long in its length direction (e.g., its aspect ratio is greater than 1) as shown in FIG. 1. In another example, the light-emitting element LD may have a rod-like shape, a bar-like shape, a pillar-like shape, or the like, which is short in its length direction (e.g., its aspect ratio is less than 1). In still another example, the light-emitting element LD may have a rod-like shape, a bar-like shape, a pillar-like shape, or the like, of which aspect ratio is 1.

The light-emitting element LD may include, for example, a light-emitting diode (LED) manufactured small enough to have a diameter D and/or a length L to a degree of a nano scale (or nanometers) to a micro scale (micrometers).

In one or more embodiments, when the light-emitting element LD is long in its length direction (e.g., its aspect ratio is greater than 1), the diameter D of the light-emitting element LD may be about 0.5 μm to about 6 μm, and the length L of the light-emitting element LD may be about 1 μm to about 10 μm. However, the diameter D and the length L of the light-emitting element LD are not limited thereto, and the size of the light-emitting element LD may be changed to accord with requirement conditions (or design conditions) of a lighting device or a self-luminous display device, to which the light-emitting element LD is applied.

In one or more embodiments, the first semiconductor layer 11 may include, for example, at least one n-type semiconductor layer. The first semiconductor layer 11 may include an upper surface in contact with the active layer 12 and a lower surface exposed to the outside along the length direction of the light-emitting element LD. The lower surface of the first semiconductor layer 11 may be one end portion (or bottom end portion) of the light-emitting element LD.

In one or more embodiments, the active layer 12 is formed on the first semiconductor layer 11, and may be formed in a single or multiple quantum well structure. In an example, when the active layer 12 is formed in the multiple quantum well structure, a barrier layer, a strain reinforcing layer, and a well layer, which constitute one unit, may be periodically and repeatedly stacked in the active layer 12. The strain reinforcing layer may have a lattice constant that is less than that of the barrier layer, to further reinforce strain (e.g., compressive strain applied to the well layer). However, the structure of the active layer 12 is not limited to the above-described embodiments.

In one or more embodiments, the active layer 12 may emit light having a wavelength of about 400 nm to about 900 nm, and use a double hetero structure. The active layer 12 may include a first surface in contact with the first semiconductor layer 11 and a second surface in contact with the second semiconductor layer 13.

In one or more embodiments, a color (or light output color) of the light-emitting element LD may be determined according to a wavelength of light emitted from the active layer 12. The color of the light-emitting element LD may determine a color of a pixel corresponding thereto. For example, the light-emitting element LD may emit red light, green light, or blue light.

In one or more embodiments, when an electric field having a voltage (e.g., predetermined voltage) or more is applied to both the end portions of the light-emitting element LD, the light-emitting element LD emits light as electron-hole pairs are combined in the active layer 12. The light emission of the light-emitting element LD is controlled by using such a principle, so that the light-emitting element LD can be used as a light source (or light-emitting source) for various light-emitting devices, including a pixel of a display device.

In one or more embodiments, the second semiconductor layer 13 is formed on the second surface of the active layer 12, and may include a semiconductor layer having a type different from that of the first semiconductor layer 11.

In one or more embodiments, the second semiconductor layer 13 may include a lower surface in contact with the second surface and an upper surface exposed to the outside along the length direction of the light-emitting element LD. The upper surface of the second semiconductor layer 13 may be the other end portion (or top end portion) of the light-emitting element LD.

In one or more embodiments, the first semiconductor layer 11 and the second semiconductor layer 13 may have different thicknesses in the length direction of the light-emitting element LD. In an example, the first semiconductor layer 11 may have a thickness relatively thicker than that of the second semiconductor layer 13 along the length direction of the light-emitting element LD. Accordingly, the active layer 12 of the light-emitting element LD may be located more adjacent to the upper surface of the second semiconductor layer 13 than the lower surface of the first semiconductor layer 11.

In one or more embodiments, although it is illustrated that each of the first semiconductor layer 11 and the second semiconductor layer 13 is configured with one layer, the present disclosure is not limited thereto. In one or more embodiments, each of the first semiconductor layer 11 and the second semiconductor layer 13 may further include at least one layer (e.g., a clad layer and/or a Tensile Strain Barrier Reducing (TSBR) layer) according to the material of the active layer 12. The TSBR layer may be a strain reducing layer located between semiconductor layers having different lattice structures to perform a buffering function for reducing a lattice constant difference. The TSBR layer may be configured with a p-type semiconductor layer, such as p-GaInP, p-AlInP or p-AlGaInP, but the present disclosure is not limited thereto.

In one or more embodiments, the light-emitting element LD may further include a contact electrode (hereinafter, referred to as a "first contact electrode") located on the top of the second semiconductor layer 13, in addition to the first semiconductor layer 11, the active layer 12, and the second semiconductor layer 13, which are described above. In other embodiments, the light-emitting element LD may further include another contact electrode (hereinafter, referred to as a "second contact electrode") located at one end of the first semiconductor layer 11.

In one or more embodiments, each of the first and second contact electrodes may be an ohmic contact electrode, but the present disclosure is not limited thereto. In some embodiments, each of the first and second contact electrodes may be a Schottky contact electrode. The first and second contact electrodes may include a conductive material.

In one or more embodiments, the light-emitting element LD may further include an insulative film 14 (or insulating film). However, in some embodiments, the insulative film 14 may be omitted, and may be provided to cover only portions of the first semiconductor layer 11, the active layer 12, and the second semiconductor layer 13.

In one or more embodiments, the insulative film 14 can reduce or prevent the likelihood of an electrical short circuit that may occur when the active layer 12 is in contact with a conductive material in addition to the first semiconductor layer 11 and the second semiconductor layer 13. Also, the insulative film 14 minimizes a surface defect of the light-emitting element LD, thereby improving the lifetime and light emission efficiency of the light-emitting element LD. Also, when a plurality of light-emitting elements LD are densely located, the insulative film 14 can reduce or prevent the likelihood of an unwanted short circuit that may occur between the light-emitting elements LD. Whether the insulative film is provided is not limited as long as the active layer 12 can reduce or prevent the likelihood of an occurrence of a short circuit with external conductive material.

In one or more embodiments, the insulative film 14 may be provided in a shape entirely surrounding an outer circumference of the light-emitting stack structure including the first semiconductor layer 11, the active layer 12, and the second semiconductor layer 13.

Although a case where the insulative film 14 is provided in a shape entirely surrounding an outer circumference of each of the first semiconductor layer 11, the active layer 12, and the second semiconductor layer 13 is described above, the present disclosure is not limited thereto.

In one or more embodiments, the insulative film 14 may include a transparent insulating material. For example, the insulative film 14 may include at least one insulating material selected from the group consisting of silicon oxide ($SiO_x$), silicon nitride ($SiN_x$), silicon oxynitride ($SiO_xN_y$), aluminum oxide ($AlO_x$), titanium dioxide ($TO_2$), hafnium oxide ($HfO_x$), titanium strontium oxide ($SrTiO_x$), cobalt oxide ($Co_xO_y$), magnesium oxide (MgO), zinc oxide (ZnO), ruthenium oxide ($RuO_x$), nickel oxide (NiO), tungsten oxide ($WO_x$), tantalum oxide ($TaO_x$), gadolinium oxide ($GdO_x$), zirconium oxide ($ZrO_x$), gallium oxide ($GaO_x$), vanadium oxide ($V_xO_y$), ZnO:Al, ZnO:B, $In_xO_y$:H, niobium oxide ($Nb_xO_y$), magnesium fluoride ($MgF_x$), aluminum fluoride ($AlF_x$), Alucone polymer film, titanium nitride (TiN), tantalum nitride (TaN), aluminum nitride ($AlN_x$), gallium nitride (GaN), tungsten nitride (WN), hafnium nitride (HfN), niobium nitride (NbN), gadolinium nitride (GdN), zirconium nitride (ZrN), vanadium nitride (VN), and the like. However, the present disclosure is not limited thereto, and various materials having insulating properties may be used as the material of the insulative film 14.

In one or more embodiments, the insulative film 14 may be provided in the form of a single layer or be provided in the form of a multi-layer including at least two layers.

The above-described light-emitting element LD may be used as a light-emitting source (or light source) for various display devices. The light-emitting element LD may be manufactured through a surface treatment process. For example, when a plurality of light-emitting elements LD are mixed in a liquid solution (or solvent) to be supplied to each pixel area (e.g., an emission area of each pixel or an emission area of each sub-pixel), each light-emitting element LD may be surface-treated such that the light-emitting elements LD are not unequally condensed in the solution but equally dispersed in the solution.

A light-emitting unit (or light-emitting device) including the above-described light-emitting element LD may be used in various types of devices that require a light source, including a display device. When a plurality of light-emitting elements LD are located in an emission area of each pixel of a display panel, the light-emitting elements LD may be used as a light source of the pixel. However, the application field of the light-emitting element LD is not limited to the above-described example. For example, the light-emitting element LD may be used for other types of electronic devices that require a light source, such as a lighting device.

However, this is merely illustrative, and a light-emitting element applied to display devices in accordance with embodiments of the present disclosure is not limited thereto. For example, the light-emitting element may be a flip-chip type micro-light-emitting diode or an organic light-emitting element including an organic emitting layer.

Figure 3:
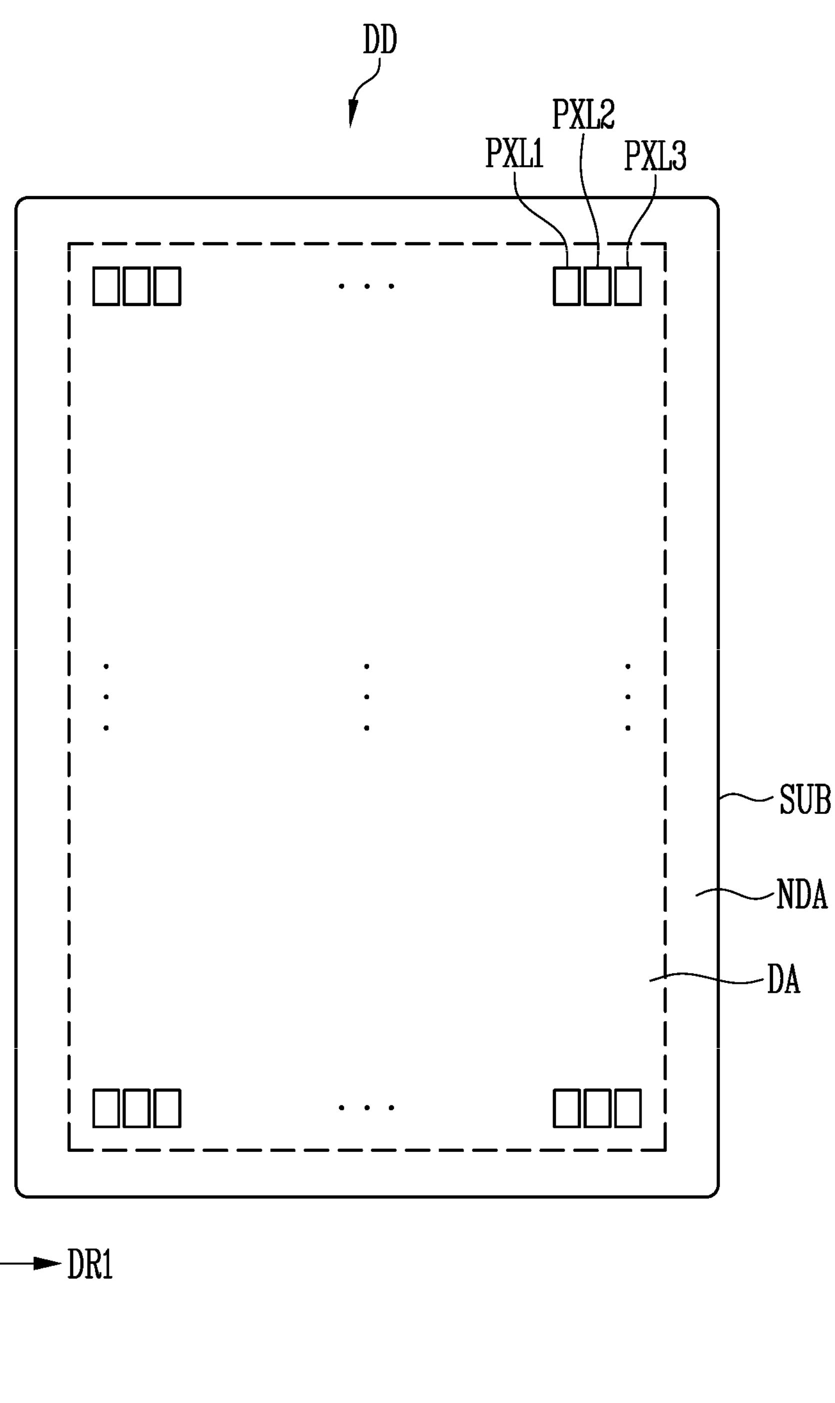
FIG. 3 is a schematic plan view illustrating a display device in accordance with embodiments of the present disclosure.

FIG. 3 is a schematic plan view illustrating a display device in accordance with embodiments of the present disclosure.

Referring to FIGS. 1, 2, and 3, the display device DD may include a substrate SUB, pixels PXL1, PXL2, and PXL3 that are provided on the substrate SUB and that each include at least one light-emitting element LD, a driving unit that is provided on the substrate SUB and that drives the pixels PXL1, PXL2, and PXL3, and a line unit that connects the pixels PXL1, PXL2, and PXL3 to the driving unit.

In one or more embodiments, the substrate SUB may include the display area DA and a non-display area NDA.

In one or more embodiments, the display area DA may be an area in which the pixels PXL1, PXL2, and PXL3 for displaying an image are provided. The non-display area NDA may be an area in which there are provided the driving unit for driving the pixels PXL1, PXL2, and PXL3, and a portion of the line unit that connects the pixels PXL1, PXL2, and PXL3 to the driving unit.

In one or more embodiments, the non-display area NDA may be located adjacent to the display area DA. The non-display area NDA may be provided at at least one side of the display area DA. In an example, the non-display area NDA may surround a circumference (or edge) of the display device DA.

In one or more embodiments, the line unit may electrically connect the pixels PXL1, PXL2, and PXL3 to the driving unit. The line unit may include a fan-out line connected to signal lines (e.g., a scan line, a data line, an emission control line, and the like), which provide signals to each of the pixels PXL1, PXL2, and PXL3 and which are connected to each of the pixels PXL1, PXL2, and PXL3.

In one or more embodiments, the substrate SUB may include a transparent insulating material to enable light to be transmitted therethrough. The substrate SUB may be a rigid substrate or a flexible substrate.

In one or more embodiments, the pixels PXL1, PXL2, and PXL3 may include a first pixel PXL1, a second pixel PXL2, and a third pixel PXL3. In one or more embodiments, the first pixel PXL1 may be a red pixel, the second pixel PXL2 may be a green pixel, and the third pixel PXL3 may be a blue pixel. However, the present disclosure is not limited thereto, and each of the pixels PXL1, PXL2, and PXL3 may respectively emit light of another color instead of red, green, and blue.

In one or more embodiments, each of the pixels PXL1, PXL2, and PXL3 may include at least one light-emitting element LD driven by a corresponding scan signal and a corresponding data signal. The light-emitting element LD may have a small size to a degree of a nano scale (or nanometers) to a micro scale (micrometers), and may be connected in parallel to light-emitting elements located adjacent thereto. However, the present disclosure is not limited thereto. The light-emitting element LD may constitute a light source of each of the pixels PXL1, PXL2, and PXL3.

Figure 4:
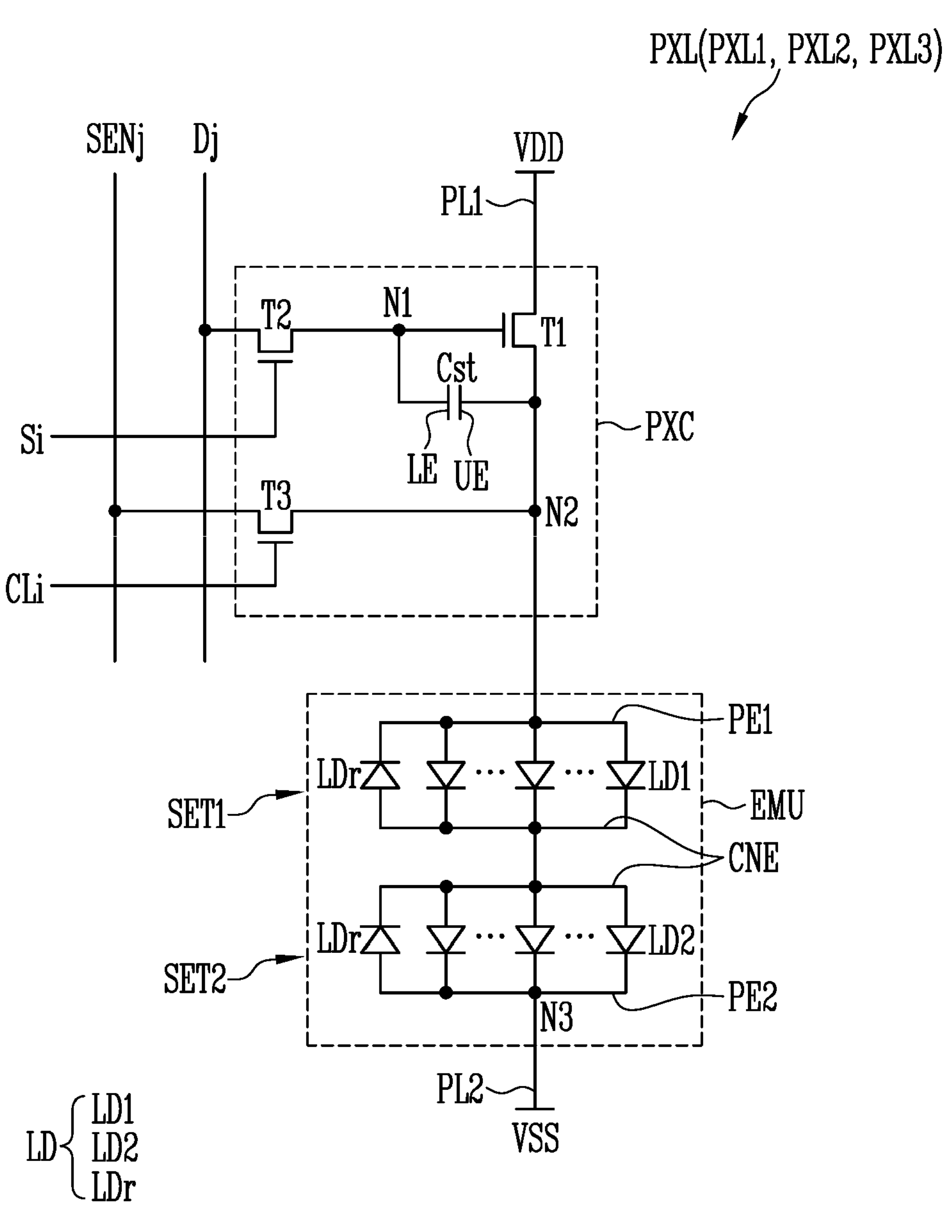
FIG. 4 is a circuit diagram illustrating an example of a pixel included in the display device shown in FIG. 3.

FIG. 4 is a circuit diagram illustrating an example of the pixel included in the display device shown in FIG. 3.

In the one or more embodiments that follow, when a first pixel PXL1, a second pixel PXL2, and a third pixel PXL3 are inclusively designated, each of the first pixel PXL1, the second pixel PXL2, and the third pixel PXL3 will be referred to as a "pixel PXL."

Referring to FIGS. 1, 2, 3, and 4, the pixel PXL may include a pixel circuit PXC and a light-emitting unit EMU (or light-emitting part).

In one or more embodiments, the light-emitting unit EMU may include light-emitting elements LD connected between a first power line PL1 and a second power line PL2. The light-emitting unit EMU may include serial stages SET1 and SET2 connected in series to each other between the first power line PL1 and the second power line PL2.

In one or more embodiments, a first serial stage SET may include first light-emitting elements LD1 electrically connected between a first pixel electrode PE1 and a connection electrode CNE. For example, a first end portion EP1 of the first light-emitting element LD1 may be connected to the first pixel electrode PE1, and a second end portion EP2 of the first light-emitting element LD1 may be connected to the connection electrode CNE. The first light-emitting elements LD1 may be connected in parallel between the first pixel electrode PE1 and the connection electrode CNE.

In one or more embodiments, as shown in FIG. 4, the first light-emitting element LD1 may be connected in the same direction (e.g., a forward direction). In an example, at least one reverse light-emitting element LDr may be further connected in the first serial stage SET1. The reverse light-emitting element LDr may be connected in the opposite direction of the direction in which the first light-emitting elements LD1 are connected between the first pixel electrode PE1 and the connection electrode CNE. Although a driving voltage in the forward direction is applied, the reverse light-emitting element LDr maintains an inactivated state, and accordingly, no current substantially flows through the reverse light-emitting element LDr.

In one or more embodiments, a second serial stage SET2 may include second light-emitting elements LD2 connected between the connection electrode CNE and a second pixel electrode PE2. For example, a first end portion of the second light-emitting element LD2 may be connected to the connection electrode CNE, and a second end portion EP2 of the second light-emitting element LD2 may be connected to the second pixel electrode PE2. The second light-emitting elements LD2 may be connected in parallel between the connection electrode CNE and the second pixel electrode PE2.

In one or more embodiments, as shown in FIG. 4, the second light-emitting elements LD2 may be connected in the forward direction. In an example, at least one reverse light-emitting element LDr may be further connected in the second serial stage SET2.

In one or more embodiments, the first serial stage SET1 and the second serial stage SET2 may be connected in series.

In one or more embodiments, the first pixel electrode PE1 may be an anode electrode of the light-emitting unit EMU, and the second pixel electrode PE2 may be a cathode electrode of the light-emitting unit EMU.

In one or more embodiments, the first serial stage SET1 and the second serial stage SET2 may be electrically connected to each other through the connection electrode CNE.

As described above, the light-emitting unit EMU of the pixel PXL, which includes the light-emitting elements LD connected in a series/parallel hybrid structure, can suitably control driving current/voltage conditions to be suitable for specifications of a product to which the light-emitting unit EMU is applied.

For example, the light-emitting unit EMU of the pixel PXL, which includes the light-emitting elements LD connected in the series/parallel hybrid structure, can decrease a driving current, as compared with a light-emitting unit having a structure in which the light-emitting elements LD are connected only in parallel. Also, the light-emitting unit EMU of the pixel PXL, which includes the light-emitting elements LD connected in the series/parallel hybrid structure, can decrease a driving voltage applied to both ends of the light-emitting unit EMU, as compared with a light-emitting unit having a structure in which the light-emitting elements LD are all connected only in series. In addition, when the light-emitting elements LD are all connected only in series, a dark spot defect may be caused while a path through which a driving current can flow in the pixel PXL is blocked, when at least one of the light-emitting elements connected in series is not completely connected in the forward direction (or when the reverse light-emitting element LDr is included). On the other hand, although some light-emitting elements LD are not connected in the forward direction (or although the reverse light-emitting element LDr is included) or although a defect occurs some light-emitting elements LD inside each serial stage when the light-emitting elements LD are connected in the series/parallel hybrid structure, a driving current can flow through another light-emitting element LD of the corresponding serial stage. Accordingly, a defect of the pixel PXL can be prevented or reduced.

In one or more embodiments, the pixel circuit PXC may be connected to a scan line Si (i is a positive integer) and a data line Dj (j is a positive integer) of the pixel PXL. Also, the pixel circuit PXC may be connected to a control line CLi and a sensing line SENj of the pixel PXL. In an example, when the pixel PXL may be located on an ith row and a jth column of the display area DA, the pixel circuit PXC of the pixel PXL may be connected an ith scan line Si, a jth data line Dj, an ith control line CLi, and a jth sensing line SENj.

In one or more embodiments, the pixel circuit PXC may include first to third transistors T1 to T3 and a storage capacitor Cst.

In one or more embodiments, the first transistor T1 may be a driving transistor for controlling a driving current applied to the light-emitting unit EMU. The first transistor T1 may be connected between a first driving power source VDD and the light-emitting element LD. A gate electrode of the first transistor T1 may be connected to a first node N1.

In one or more embodiments, the first transistor T1 may control an amount of driving current applied from the first driving power source VDD to the light-emitting unit EMU through a second node N2 according to a voltage applied to the first node N1.

In one or more embodiments, the second transistor T2 may be a switching transistor that selects a pixel PXL in response to a scan signal and activates the pixel PXL. The second transistor T2 may be connected to the data line Dj and the first node N1. A gate electrode of the second transistor T2 may be connected to the scan line Si.

In one or more embodiments, the second transistor T2 may be turned on by a scan signal supplied to the scan line Si, and may transfer a data signal to the gate electrode of the first transistor T1.

In one or more embodiments, the third transistor T3 may connect the first transistor T1 to the sensing line SENj to acquire a sensing signal through the sensing line SENj and to detect a characteristic of the pixel PXL, including a threshold voltage of the first transistor T1, and the like, by using the sensing signal. Information on the characteristic of the pixel PXL may be used to convert image data such that a characteristic deviation between pixels can be compensated.

In one or more embodiments, the third transistor T3 may be connected between the sensing line SENj and the second node N2. A gate electrode of the third transistor T3 may be connected to the control line CLi.

In one or more embodiments, a voltage of an initialization power source may be provided through the sensing line SENj in a period (e.g., predetermined period). The third transistor T3 may be turned on when a sensing control signal is supplied from the control line CLi, to transfer the voltage of the initialization power source to the second node N2. Accordingly, a voltage stored in the storage capacitor Cst connected to the second node N2 may be initialized.

In one or more embodiments, the storage capacitor Cst may include a first storage electrode LE and a second storage electrode UE. The first storage electrode LE may be electrically connected to the first node N1, and the second storage electrode UE may be electrically connected to the second node N2. The storage capacitor Cst may be connected between the first node N1 and the second node N2. The storage capacitor Cst may charge a data voltage corresponding to the data signal supplied to the first node N1 during one frame period. Accordingly, the storage capacitor Cst may store a voltage corresponding to the difference between a voltage of the gate electrode of the first transistor T1 and a voltage of the second node N2.

In embodiments of the present disclosure, a two-series structure (e.g., the first and second serial stages SET1 and SET2) as shown in FIG. 4 may be applied to the light-emitting unit EMU by considering the resolution of the display device DD, the area of an emission area of the pixel PXL, and the like. Hereinafter, embodiments will be described based on the light-emitting unit EMU having the two-series structure.

Figure 5:
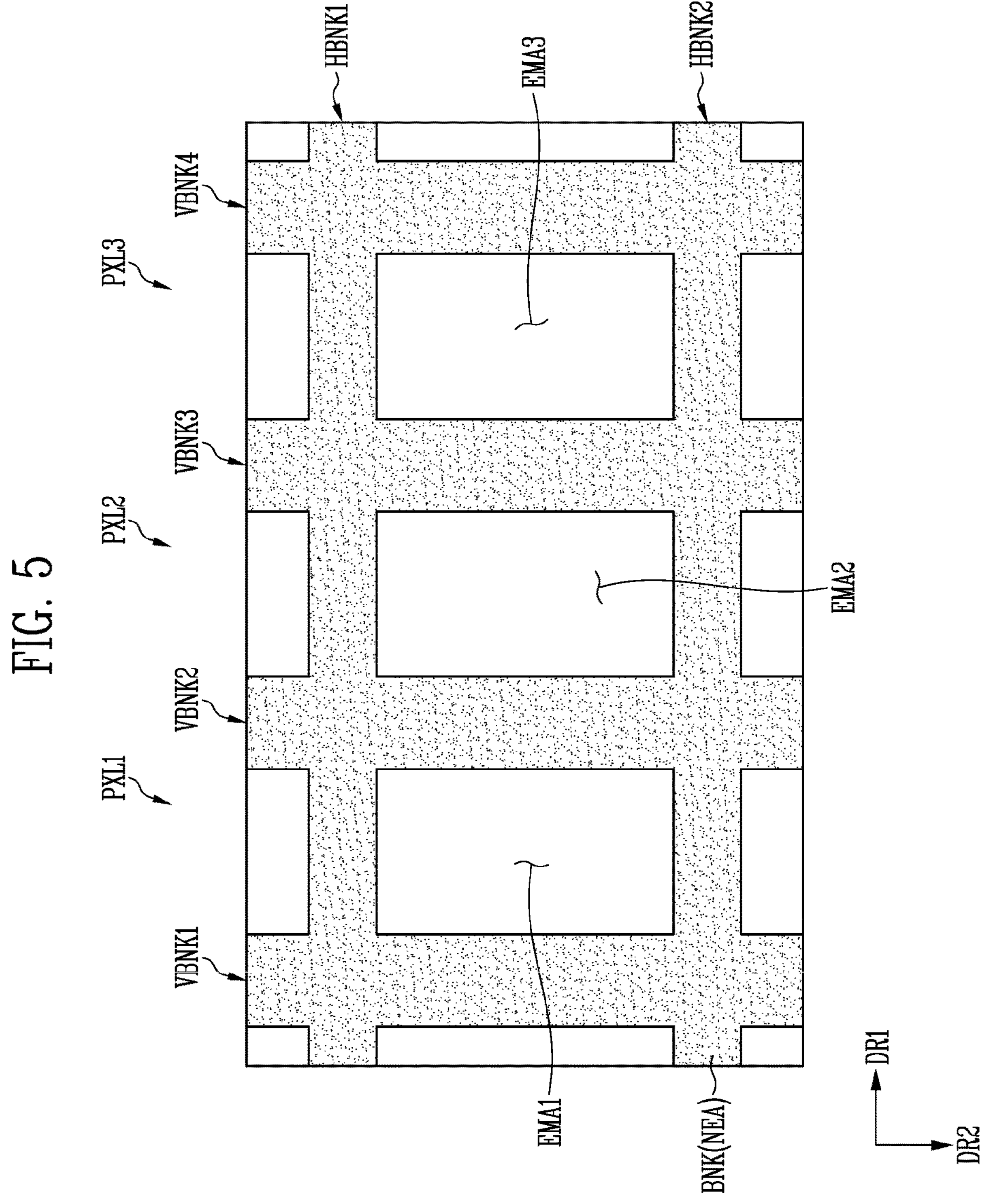
FIG. 5 is a schematic plan view illustrating an example of a bank partitioning pixels included in the display device shown in FIG. 3.
Figure 6A:
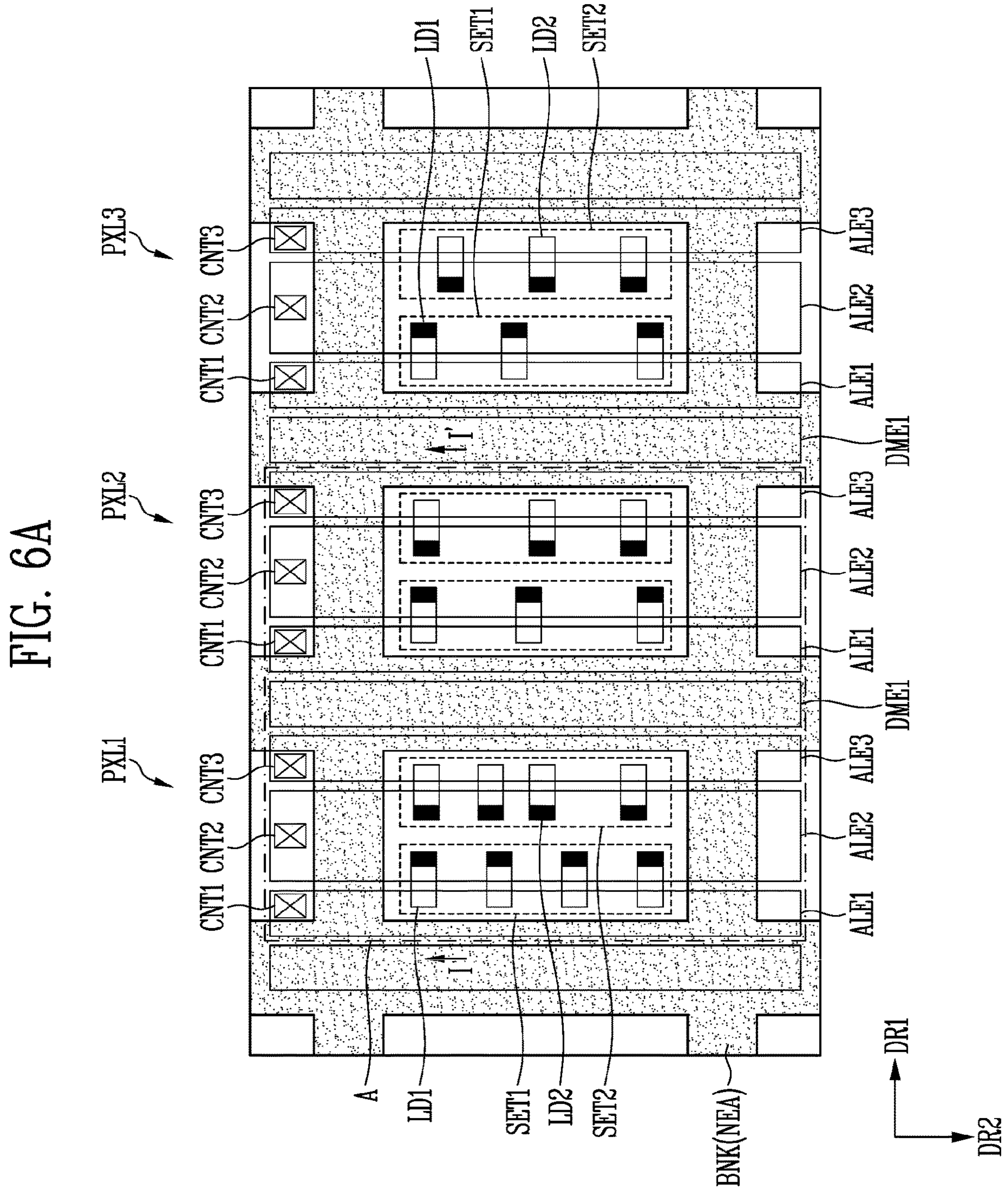
Figure 6B:
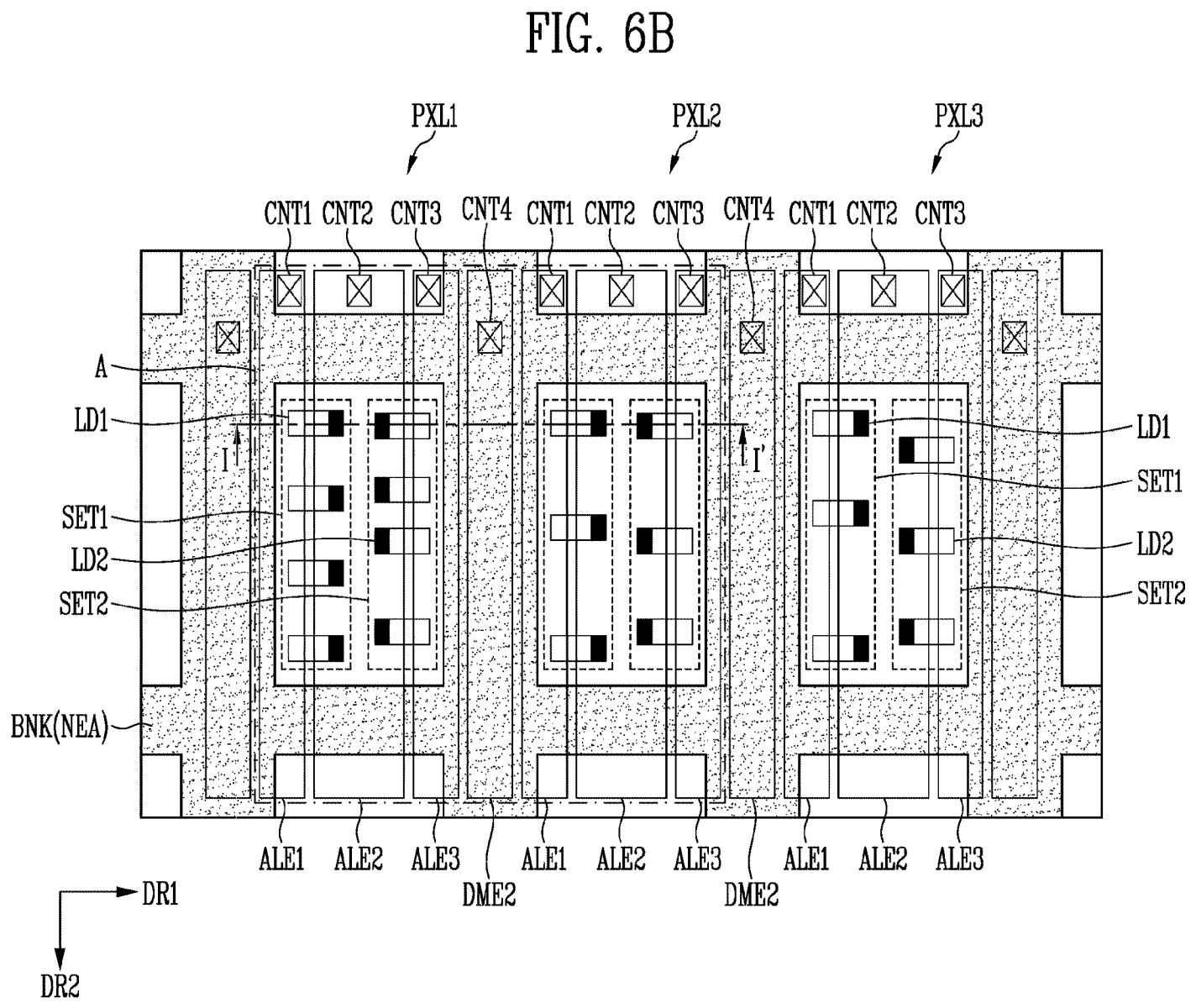
Figure 7:
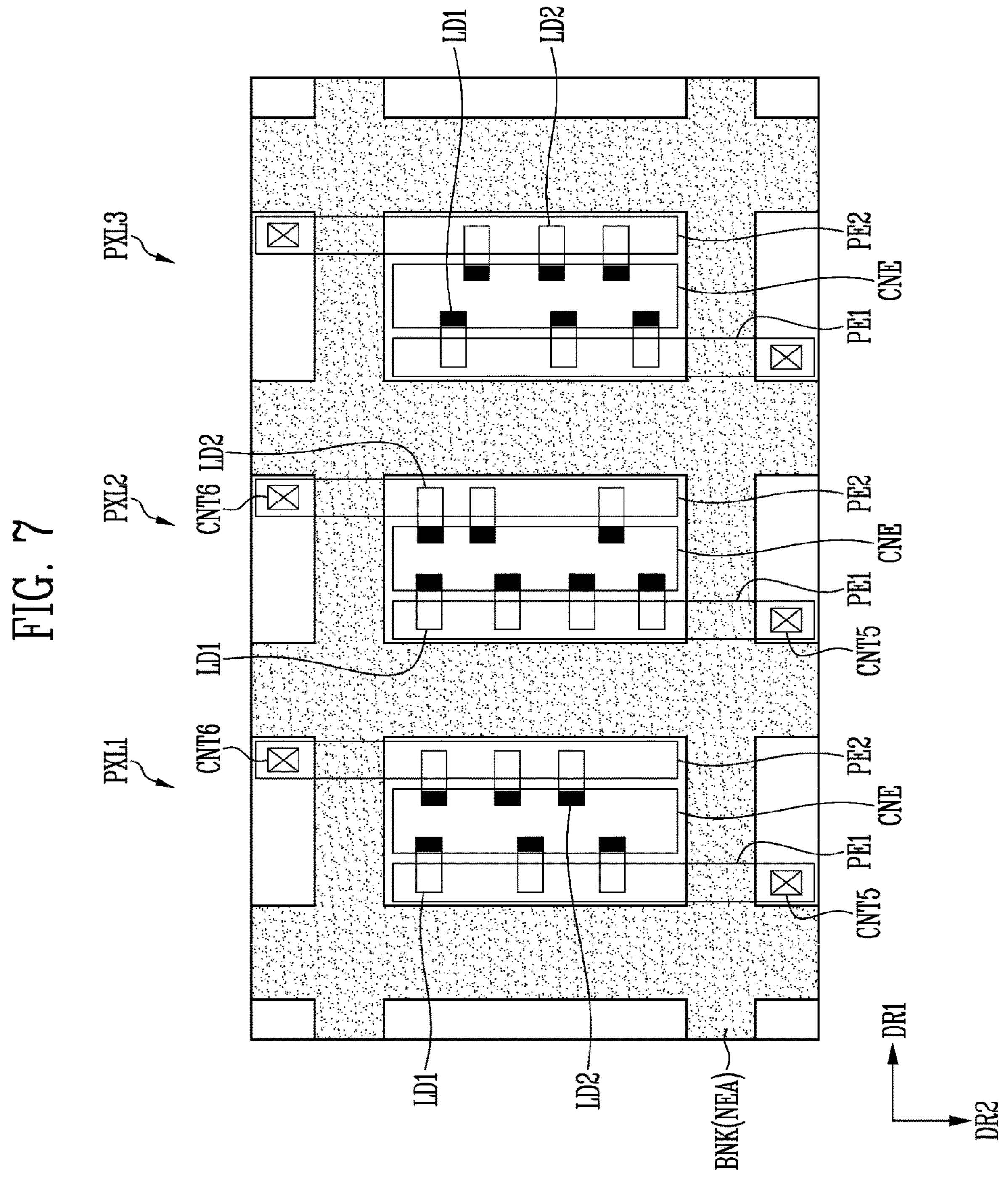

FIG. 5 is a schematic plan view illustrating an example of a bank partitioning the pixels included in the display device shown in FIG. 3. FIGS. 6A, 6B, and 7 are schematic plan views illustrating an example of the pixels included in the display device shown in FIG. 3.

FIG. 5 is a view illustrating emission areas EMA1, EMA2, and EMA3 and a non-emission area NEA of first, second, and third pixels PXL1, PXL2, and PXL3, and a bank BNK is mainly illustrated.

FIGS. 6A, 6B, and 7 are views illustrating some components included in each of the first, second, and third pixels PXL1, PXL2, and PXL3, based on the bank BNK shown in FIG. 5.

FIGS. 6A and 6B are views mainly illustrating light-emitting elements LD1 and LD2 and alignment electrodes ALE1 to ALE3, and FIG. 7 is a view mainly illustrating the light-emitting elements LD1 and LD2, pixel electrodes PE1 and PE2, and a connection electrode CNE.

Referring to FIGS. 5 to 7, the display device DD may include the bank BNK, the alignment electrodes ALE1 to ALE3, the light-emitting elements LD1 and LD2, the pixel electrodes PE1 and PE2, and the connection electrode CNE so as to constitute the pixels PXL1, PXL2, and PXL3.

As shown in FIG. 5, the bank BNK may partition the first pixel PXL1, the second pixel PXL2, and the third pixel PXL3. The first pixel PXL1 may include a first emission area EMA1, the second pixel PXL2 may include a second emission area EMA2, and the third pixel PXL3 may include a third emission area EMA3.

In one or more embodiments, the first emission area EMA1, the second emission area EMA2, and the third emission area EMA3 may correspond to openings defined by the bank BNK.

In one or more embodiments, the bank BNK may form a space in which a fluid can be accommodated. For example, during a manufacturing process, an ink including the light-emitting elements LD1 and LD2 may be provided in the space in which the fluid can be accommodated.

In one or more embodiments, the non-emission area NEA may be an area substantially corresponding to the bank BNK. When viewed on a plane, the bank BNK may surround each of the first emission area EMA1, the second emission area EMA2, and the third emission area EMA3.

In one or more embodiments, the bank BNK may include a first horizontal extension part HBNK1 and a second horizontal extension part HBNK2, which extend in a first direction DR1. The first horizontal extension part HBNK1 and the second horizontal extension part HBNK2 may be spaced apart from each other in a second direction DR2 (e.g., a vertical direction).

In one or more embodiments, the bank BNK may include a first vertical extension part VBNK1, a second vertical extension part VBNK2, a third vertical extension part VBNK3, and a fourth vertical extension part VBNK4, which extend in the second direction DR2. In an example, the first vertical extension part VBNK1, the second vertical extension part VBNK2, the third vertical extension part VBNK3, and the fourth vertical extension part VBNK4 may be spaced apart from each other in the first direction DR1.

In one or more embodiments, the first emission area EMA1 may be formed (defined) by an area in which the first vertical extension part VBNK1, the second vertical extension part VBNK2, the first horizontal extension part HBNK1, and the second horizontal extension part HBNK2 cross each other. Similarly, the second emission area EMA2 may be formed (defined) by an area in which the second vertical extension part VBNK2, the third vertical extension part VBNK3, the first horizontal extension part HBNK1, and the second horizontal extension part HBNK2 cross each other. The third emission area EMA3 may be formed (defined) by an area in which the third vertical extension part VBNK3, the fourth vertical extension part VBNK4, the first horizontal extension part HBNK1, and the second horizontal extension part HBNK2 cross each other. Therefore, the first emission area EMA1, the second emission area EMA2, and the third emission area EMA3 may be sequentially arranged in the first direction DR1.

In one or more embodiments, the first emission area EMA1 may be located adjacent to the second emission area EMA2 with the second vertical extension part VBNK2 interposed therebetween. The second emission area EMA2 may be located adjacent to the third emission area EMA3 with the third vertical extension part VBNK3 interposed therebetween.

In one or more embodiments, as the resolution of the display device DD increases, the number of pixels included in the same area increases. This result in that the area of the first to third emission areas EMA1, EMA2, and EMA3 decreases, and it is substantially difficult to constitute two or more serial stages by using light-emitting elements. Therefore, as shown in FIGS. 6A, 6B, and 7, each of the first to third emission areas EMA1, EMA2, and EMA3 may include two serial stages SET1 and SET2.

Referring to FIGS. 6A and 6B, each of the first to third pixels PXL1, PXL2, and PXL3 may include a first alignment electrode ALE1, a second alignment electrode ALE2, and a third alignment electrode ALE3. In an example, first to third alignment electrodes ALE1, ALE2, and ALE3 of each of the second pixel PXL2 and the third pixel PXL3 are substantially identical to alignment electrodes ALE1, ALE2, and ALE3 of the first pixel PXL1, and therefore, the first pixel PXL1 will be mainly described.

In one or more embodiments, the first to third alignment electrodes ALE1, ALE2, and ALE3 may be sequentially arranged while being spaced apart from each other in the first direction DR1. The first to third alignment electrodes ALE1, ALE2, and ALE3 may be located under the bank BNK.

In one or more embodiments, the first to third alignment electrodes ALE1, ALE2, and ALE3 may be electrodes for respectively aligning the light-emitting elements LD1 and LD2. For example, an electric field may be formed between (or on) the first alignment electrode ALE1 and the second alignment electrode ALE2, and first light-emitting elements LD1 may be aligned on the first alignment electrode ALE1 and the second alignment electrode ALE2, based on the electric field. For example, the light-emitting elements LD1 and LD2 may be moved (or rotated) by a force (e.g., dielectrophoresis (DEP) force) according to the electric field to be aligned (or located) on the alignment electrodes.

In one or more embodiments, each of the first to third alignment electrodes ALE1, ALE2, and ALE3 may be supplied (or provided) with a first alignment signal or a second alignment signal in a process of aligning the light-emitting elements LD1 and LD2 (hereinafter, referred to as an alignment process).

In one or more embodiments, the first alignment signal and the second alignment signal may have different wavelengths, different potentials, and/or different phases. The first alignment signal may be a ground signal, and the second alignment signal may be an AC signal. However, the present disclosure is not necessarily limited to the above-described example. For example, the first alignment signal may be the AC signal, and the second alignment signal may be the ground signal.

In one or more embodiments, the first alignment signal may be applied to the first alignment electrode ALE1 and the third alignment electrode ALE3. The second alignment signal may be applied to the second alignment electrode ALE2 located between the first alignment electrode ALE1 and the third alignment electrode ALE3.

In one or more embodiments, the first alignment electrode ALE1 may overlap with the first vertical extension part VBNK1 of the bank BNK and the first emission area EMA1.

In one or more embodiments, the first alignment electrode ALE1 may be connected to a first signal line thereunder through a first contact hole CNT1, and the first alignment signal may be provided to the first alignment electrode ALE through the first signal line in the alignment process.

In one or more embodiments, the second alignment electrode ALE2 may be located adjacent to the first alignment electrode ALE1 in the first direction DR1, and may extend in the second direction DR2. The second alignment electrode ALE2 may overlap with the first emission area EMA1.

In one or more embodiments, the second alignment electrode ALE2 may be connected to a second signal line thereunder through a second contact hole CNT2, and the second alignment signal may be provided to the second alignment electrode ALE2 through the second signal line in the alignment process.

In one or more embodiments, the third alignment electrode ALE3 may overlap with the second vertical extension part VBNK2 of the bank BNK and the first emission area EMA1. In an example, the third alignment electrode ALE3 may be located adjacent to the second alignment electrode ALE2 in the first direction DR1, and may extend in the second direction DR2.

In one or more embodiments, the third alignment electrode ALE3 may be connected to a first signal line thereunder through a third contact hole CNT3, and the first alignment signal may be provided to the third alignment electrode ALE3 through the first signal line.

In one or more embodiments, a planar shape of the first alignment electrode ALE1 may be substantially identical to a planar shape of the third alignment electrode ALE3, and the same alignment signal may be supplied to the first alignment electrode ALE1 and the third alignment electrode ALE3.

In one or more embodiments, a width of the second alignment electrode ALE2 in the first direction DR1 may be greater than a width of the first alignment electrode ALE1 in the first direction DR1 and/or may be greater than a width of the third alignment electrode ALE3 in the first direction DR1. For example, when viewed on a plane, a sectional area of the second alignment electrode ALE2 may be wider than a sectional area of each of the first and third alignment electrode ALE1 and ALE3.

In one or more embodiments, when viewed on a plane, each of the first to third contact holes CNT1, CNT2, and CNT3 may be located in one area of each of the first to third alignment electrodes ALE1, ALE2, and ALE3, which corresponds to an area not overlapping with the bank BNK.

Referring to FIG. 6A, each of the first pixel PXL1 and the second pixel PXL2 may include a dummy electrode DME1. In an example, a dummy electrode DME1 of the second pixel PXL2 is substantially identical to a dummy electrode DME1 of the first pixel PXL1, and therefore, the first pixel PXL1 will be mainly described.

In one or more embodiments, the dummy electrode DME1 may be located between the first emission area EMA1 and the second emission area EMA2. In an example, the dummy electrode DME1 may be located in the non-emission area NEA. The dummy electrode DME1 may be located to overlap with the second vertical extension part VBNK2 of the bank BNK.

In one or more embodiments, the dummy electrode DME1 may be located on the top of the bank BNK. In an example, the dummy electrode DME1 may be located on the second vertical extension part VBNK2 of the bank BNK.

In one or more embodiments, the dummy electrode DME1 may be located adjacent to the third alignment electrode ALE3 of the first pixel PXL1 in the first direction DR1, and may extend in the second direction DR2. In an example, the dummy electrode DME1 may be located between the third alignment electrode ALE3 of the first pixel PXL1, and the first alignment electrode ALE1 of the second pixel PXL2.

In one or more embodiments, when viewed on a plane, the dummy electrode DME1 might not overlap with the third alignment electrode ALE3 of the first pixel PXL1 or with the first alignment electrode ALE1 of the second pixel PXL2.

In one or more embodiments, the dummy electrode DME1 may have an island shape (e.g., a floating state). In an example, the dummy electrode DME1 may be a floating electrode. The dummy electrode DME1 might not be connected to other conductive layers (or conductive patterns) in the alignment process, and there may be no electrical signal provided to the dummy electrode DME1.

In one or more embodiments, the electrically floated dummy electrode DME may be located between the third alignment electrode ALE3 of the first pixel PXL1 and the first alignment electrode ALE1 of the second pixel PXL2 in the alignment process, so that any electric field is not formed on the top of the bank BNK. Accordingly, second light-emitting elements LD2 of the first pixel PXL1 and first light-emitting elements LD1 of the second pixel PXL2 may not be biased in any one direction. In addition, the second light-emitting elements LD2 of the first pixel PXL1 may be aligned between the second alignment electrode ALE2 and the third alignment electrode ALE3 of the first pixel PXL1, and the first light-emitting elements LD1 of the second pixel PXL2 may be aligned between the first alignment electrode ALE1 and the second alignment electrode ALE2 of the second pixel PXL2. Thus, an arrangement failure of the first and second light-emitting elements LD1 and LD2 can be minimized or reduced.

Referring to FIG. 6B, each of the first pixel PXL1 and the second pixel PXL2 may include a dummy electrode DME2. In an example, a dummy electrode DME2 of the second pixel electrode PXL2 is substantially identical to a dummy electrode DME2 of the first pixel PXL1, and therefore, the first pixel PXL1 will be mainly described.

In a relationship between the dummy electrode DME2 shown in FIG. 6B and the dummy electrode DME1 shown in FIG. 6A, shape and position relationships, with the exception of an electrical connection relationship, may be equally applied in the alignment process.

In one or more embodiments, the dummy electrode DME2 may be located between the first emission area EMA1 and the second emission area EMA2. In an example, the dummy electrode DME2 may be located in the non-emission area NEA. The dummy electrode DME2 may be located to overlap with the second vertical extension part VBNK2 of the bank BNK.

In one or more embodiments, the dummy electrode DME2 may be located on the top of the bank BNK. In an example, the dummy electrode DME2 may be located on the second vertical extension part VBNK2 of the bank BNK.

In one or more embodiments, the dummy electrode DME2 may be located adjacent to the third alignment electrode ALE3 of the first pixel PXL1 in the first direction DR1, and may extend in the second direction DR2. In an example, the dummy electrode DME2 may be located between the third alignment electrode ALE3 of the first pixel PXL1, and the first alignment electrode ALE1 of the second pixel PXL2.

In one or more embodiments, when viewed on a plane, the dummy electrode DME2 might not overlap with the third alignment electrode ALE3 of the first pixel PXL1 and the first alignment electrode ALE1 of the second pixel PXL2.

In one or more embodiments, the dummy electrode DME2 may be connected to a first signal line thereunder through a fourth contact hole CNT4 in the alignment process, so that the first alignment signal is provided to the dummy electrode DME2 through the first signal line in the alignment process. In an example, the same alignment signal may be supplied to the first alignment electrode ALE1, the third alignment electrode ALE3, and the dummy electrode DME2.

In one or more embodiments, as the same alignment signal as an alignment signal supplied to the first alignment electrode ALE1 and the third alignment electrode ALE3 is supplied to the dummy electrode DME2 in the alignment process, there may be no electric field formed on the top of the bank BNK, or a very weak electric field may be formed on the top of the bank BNK.

Accordingly, the second light-emitting elements LD2 of the first pixel PXL1 and the first light-emitting elements LD1 of the second pixel PXL2 are not biased in any one direction. Further, the second light-emitting elements LD2 of the first pixel PXL1 are aligned between the second alignment electrode ALE2 and the third alignment electrode ALE3 of the first pixel PXL1, and the first light-emitting elements LD1 of the second pixel PXL2 are aligned between the first alignment electrode ALE1 and the second alignment electrode ALE2 of the second pixel PXL2. Thus, an arrangement failure of the first and second light-emitting elements LD1 and LD2 can be minimized or reduced.

In one or more embodiments, the fourth contact hole CNT4 formed in the dummy electrode DME2 may be located to overlap with the bank BNK when viewed on a plane.

Referring to FIGS. 6A and 6B, the dummy electrode DME1 and the dummy electrode DME2 may include a reflective material. A reflective wall structure may be formed at the periphery of the light-emitting elements LD1 and LD2. Accordingly, light emitted from the light-emitting elements LD1 and LD2 advances in an upper direction of the pixel PXL (e.g., an image direction of the display device), so that the light efficiency of the pixel PXL can be further improved.

In one or more embodiments, the dummy electrode DME1 or the dummy electrode DME2 is located between the first emission area EMA1 of the first pixel PXL1 and the second emission area EMA2 of the second pixel PXL2, thereby improving the efficiency of light emitted from the light-emitting elements LD1 and LD2.

Referring to FIG. 7, each of the first pixel PXL1, the second pixel PXL2, and the third pixel PXL3 may include a first pixel electrode PE1, a second pixel electrode PE2, and a connection electrode CNE. A first pixel electrode PE1, a second pixel electrode PE2, and a connection electrode CNE of each of the second pixel PXL2 and the third pixel PXL3 are substantially identical to a first pixel electrode PE1, a second pixel electrode PE2, and a connection electrode CNE of the first pixel PXL1, and therefore, the first pixel PXL1 will be mainly described.

In one or more embodiments, the first pixel electrode PE1, the second pixel electrode PE2, and the connection electrode CNE may be located on the alignment electrodes ALE1 to ALE3 and the light-emitting elements LD1 and LD2.

In one or more embodiments, the first pixel electrode PE1, the connection electrode CNE, and the second pixel electrode PE2 may be sequentially arranged in the first direction DR1 in the first emission area EMA1.

In one or more embodiments, a portion of the first pixel electrode PE1 may overlap with the bank BNK. Also, the first pixel electrode PE1 may overlap with a portion of the first alignment electrode ALE1. The first pixel electrode PE1 may be electrically connected to a transistor (e.g., the first transistor T1 shown in FIG. 4) thereunder through a fifth contact hole CNT5 at a portion not overlapping with the first alignment electrode ALE1. In an example, the first pixel electrode PE1 may be insulated from the first alignment electrode ALE1. However, this is merely illustrative, and the first pixel electrode PE1 of the first pixel PXL1 may be connected to the first alignment electrode ALE1 thereunder.

In one or more embodiments, the connection electrode CNE may be located in the first emission area EMA1. In an example, the first light-emitting elements LD1 may be connected (e.g., in parallel) to the first pixel electrode PE1 and the connection electrode CNE. For example, the first pixel electrode PE1 may be electrically connected to a first end portion of the first light-emitting element LD1, and the connection electrode CNE may be connected to a second end portion of the first light-emitting element LD1.

In one or more embodiments, the connection electrode CNE may overlap with a portion of the second alignment electrode ALE2. The connection electrode CNE and the second alignment electrode ALE2 may be insulated from each other. For example, the second contact hole CNT2 of the second alignment electrode ALE2 may be formed while avoiding the connection electrode CNE.

In one or more embodiments, the second pixel electrode PE2 may be adjacent to the connection electrode CNE. A portion of the second pixel electrode PE2 may overlap with the bank BNK. Also, the second pixel electrode PE2 may overlap with a portion of the third alignment electrode ALE3.

In one or more embodiments, the second pixel electrode PE2 may be electrically connected to a second power line (e.g., the second power line PL2 shown in FIG. 4) thereunder through a sixth contact hole CNT6. The second pixel electrode PE2 may be insulated from the third alignment electrode ALE3. However, this is merely illustrative, and the second pixel electrode PE2 of the first pixel PXL1 may be connected to the third alignment electrode ALE3 thereunder.

Figure 8:
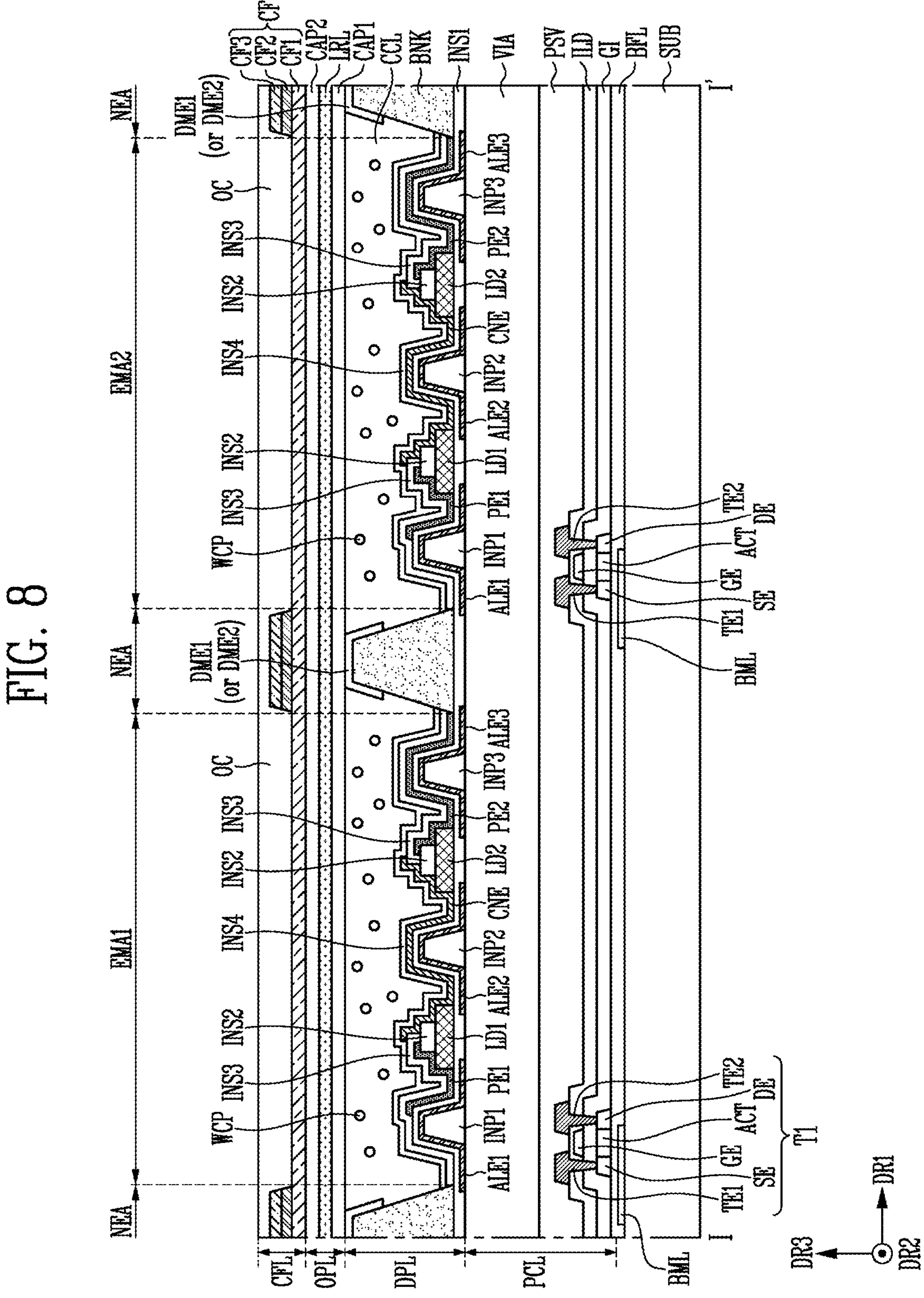
FIG. 8 is a schematic sectional view illustrating an example taken along the line I-I' shown in FIGS. 6A and 6B.

FIG. 8 is a schematic sectional view illustrating an example taken along the line I-I' shown in FIGS. 6A and 6B.

Referring to FIG. 8, the first pixel PXL1 may include a substrate SUB, a pixel circuit layer PCL, a display element layer DPL, an optical layer OPL, and a color filter layer CFL.

In one or more embodiments, the substrate SUB may form a base member of the display device DD. The substrate SUB may be a rigid or flexible substrate or film. The substrate SUB may include a transparent insulating material to enable light to be transmitted therethrough.

In one or more embodiments, the substrate SUB may be a rigid substrate. For example, the rigid substrate may be one of a glass substrate, a quartz substrate, a glass ceramic substrate, and/or a crystalline glass substrate. In an example, the substrate SUB may be a flexible substrate. The flexible substrate may be one of a film substrate and a plastic substrate, which include a polymer organic material. However, the material constituting the substrate SUB may be variously changed, and may include a fiber reinforced plastic (FRP), and the like.

In one or more embodiments, the pixel circuit layer PCL may be located on the substrate SUB.

As shown in FIG. 8, the pixel circuit layer PCL may include a lower auxiliary electrode BML, a buffer layer BFL, a first transistor T1, a gate insulating layer GI, an interlayer insulating layer ILD, and a protective layer PSV. For convenience of description, only the first transistor T1 among circuit elements is illustrated in FIG. 8.

In one or more embodiments, the lower auxiliary electrode BML may be located on the substrate SUB. The lower auxiliary electrode BML may serve as a path through which an electrical signal is moved. In some embodiments, a portion of the lower auxiliary electrode BML may overlap with the first transistor T1 when viewed on a plane.

In one or more embodiments, the buffer layer BFL may be located on the substrate SUB. The buffer layer BFL may cover the lower auxiliary electrode BML. The buffer layer BFL may reduce or prevent the likelihood of an impurity from being diffused from the outside. The buffer layer BFL may include one of silicon oxide ($SiO_x$), silicon nitride ($SiN_x$), silicon oxynitride ($SiO_xN_y$), aluminum oxide ($AlO_x$), and titanium oxide ($TiO_x$).

In one or more embodiments, the first transistor T1 may be electrically connected to light-emitting elements LD1 and LD2. The first transistor T1 may include an active layer ACT, a first transistor electrode TE1, a second transistor electrode TE2, and a gate electrode GE.

In one or more embodiments, the active layer ACT may mean a semiconductor layer. The active layer ACT may be located on the buffer layer BFL. The active layer ACT may include one of poly-silicon, Low Temperature Polycrystalline Silicon (LTPS), amorphous silicon, and an oxide semiconductor.

In one or more embodiments, the active layer ACT may include a first contact region in contact with the first transistor electrode TE1 and a second contact region in contact with the second transistor electrode TE2. The first contact region and the second contact region may correspond to a semiconductor pattern doped with an impurity. A region between the first contact region and the second contact region may be a channel region. The channel region may correspond to an intrinsic semiconductor pattern undoped with the impurity.

In one or more embodiments, the gate electrode GE may be located on the gate insulating layer GI. A position of the gate electrode GE may correspond to a position of the channel region of the active layer ACT. For example, the gate electrode GE may be located on the channel region of the active layer ACT with the gate insulating layer GI interposed therebetween.

In one or more embodiments, the gate insulating layer GI may be located over the active layer ACT. The gate insulating layer GI may include one of silicon oxide ($SiO_x$), silicon nitride ($SiN_x$), silicon oxynitride ($SiO_xN_y$), aluminum oxide ($AlO_x$), and titanium oxide ($TiO_x$).

In one or more embodiments, the interlayer insulating layer ILD may be located over the gate electrode GE. The interlayer insulating layer ILD may include one of silicon oxide ($SiO_x$), silicon nitride ($SiN_x$), silicon oxynitride ($SiO_xN_y$), aluminum oxide ($AlO_x$), and titanium oxide ($TiO_x$).

In one or more embodiments, the first transistor electrode TE1 and the second transistor electrode TE2 may be located on the interlayer insulating layer ILD. The first transistor electrode TE1 may be in contact with the first contact region of the active layer ACT while penetrating the gate insulating layer GI and the interlayer insulating layer ILD, and the second transistor electrode TE2 may be in contact with the second contact region of the active layer ACT while penetrating the gate insulating layer GI and the interlayer insulating layer ILD. In an example, the first transistor electrode TE1 may be a drain electrode, and the second transistor electrode TE2 may be a source electrode. However, the present disclosure is not limited thereto.

In one or more embodiments, the protective layer PSV may be located over the first transistor electrode TE1 and the second transistor electrode TE2. The protective layer PSV may include an organic material and/or an inorganic material.

In one or more embodiments, the display element layer DPL may be located on the pixel circuit layer PCL. The display element layer DPL may include a first insulating pattern INP1, a second insulating pattern INP2, a third insulating pattern INP3, a first alignment electrode ALE1, a second alignment electrode ALE2, a third alignment electrode ALE3, a dummy electrode DME1 (or DME2), a first insulating layer INS1, a bank BNK, a first light-emitting element LD1, a second light-emitting element LD2, a first pixel electrode PE1, a connection electrode CNE, a second pixel electrode PE2, and a color conversion layer CCL.

In one or more embodiments, the first insulating pattern INP1, the second insulating pattern INP2, and the third insulating pattern INP3 may be located on the protective layer PSV. The first insulating pattern INP1, the second insulating pattern INP2, and the third insulating pattern INP3 may protrude in a thickness direction of the substrate SUB (e.g., a third direction DR3). The first insulating pattern INP1, the second insulating pattern INP2, and the third insulating pattern INP3 may include an organic material and/or an inorganic material.

In one or more embodiments, the first light-emitting element LD1 may be located between the first insulating pattern INP1 and the second insulating pattern INP2. The second light-emitting element LD2 may be located between the second insulating pattern INP2 and the third insulating pattern INP3. For example, each of the first, second, and third insulating patterns INP1, INP2, and INP3 may define spaces in which first light-emitting elements LD1 and second light-emitting elements LD2 are respectively accommodated and arranged.

In one or more embodiments, the first alignment electrode ALE1, the second alignment electrode ALE2, and the third alignment electrode ALE3 may be located on the protective layer PSV. A portion of the first alignment electrode ALE1 may be located over the first insulating pattern INP1, a portion of the second alignment electrode ALE2 may be located over the second insulating pattern INP2, and a portion of the third alignment electrode ALE3 may be located over the third insulating pattern INP3. Each of the first alignment electrode ALE1, the second alignment electrode ALE2, and the third alignment electrode ALE3 may serve as a reflective partition wall.

In one or more embodiments, the first alignment electrode ALE1 and the third alignment electrode ALE3 may be insulated from the light-emitting elements LD1 and LD2. In one or more other embodiments, the first alignment electrode ALE1 may be electrically connected to the first light-emitting element LD1 through the first pixel electrode PE1, and the third alignment electrode ALE3 may be electrically connected to the second light-emitting element LD2 through the second pixel electrode PE2.

In one or more embodiments, the second alignment electrode ALE2 may be insulated from the light-emitting elements LD1 and LD2.

The first to third alignment electrodes ALE1 to ALE3 may include a conductive material. For example, the first to third alignment electrodes ALE1 to ALE3 may include one of silver (Ag), magnesium (Mg), aluminum (Al), platinum (Pt), palladium (Pd), gold (Au), nickel (Ni), neodymium (Nd), iridium (Ir), chromium (Cr), titanium (Ti), and alloys thereof. However, the present disclosure is not limited to the above-described example.

In one or more embodiments, the first insulating layer INS1 may be located on the protective layer PSV. The first insulating layer INS may cover the first to third alignment electrodes ALE1 to ALE3. The first insulating layer INS1 may stabilize connection between electrode components, and reduce external influence. The first insulating layer INS1 may include one of silicon oxide ($SiO_x$), silicon nitride ($SiN_x$), silicon oxynitride ($SiO_xN_y$), aluminum oxide ($AlO_x$), and titanium oxide ($TiO_x$).

In one or more embodiments, the bank BNK may be located on the first insulating layer INS1. The bank BNK may protrude in the thickness direction of the substrate SUB. The bank BNK may have a form surrounding the first emission area EMA1. In accordance with one or more embodiments, the bank BNK may include an organic material and/or an inorganic material. The bank BNK may correspond to the non-emission area NEA.

In one or more embodiments, the dummy electrode DME1 (or DME2) may be located on the bank BNK. In an example, the dummy electrode DME1 (or DME2) may be located to overlap with the bank BNK. The dummy electrode DME1 (or DME2) may be located between the third alignment electrode ALE3 of the first pixel PXL1 and the first alignment electrode ALE1 of the second pixel PXL2.

In an example, the dummy electrode DME1 (or DME2) may be located in the non-emission area NEA between the first emission area EMA1 of the first pixel PXL1 and the second emission area EMA2 of the second pixel PXL2.

In one or more embodiments, the dummy electrode DME1 (or DME2) may be located while being spaced apart from the third alignment electrode ALE3 of the first pixel PXL1 and the first alignment electrode ALE1 of the second pixel PXL2. In an example, the dummy electrode DME1 (or DME2) might not overlap with the third alignment electrode ALE3 of the first pixel PXL1 and the first alignment electrode ALE1 of the second pixel PXL2.

In one or more embodiments, the dummy electrode DME1 may be electrically insulated from the third alignment electrode ALE3 of the first pixel PXL1 and the first alignment electrode ALE1 of the second pixel PXL2. In an example, the dummy electrode DME1 may be a floating electrode.

In one or more other embodiments, the dummy electrode DME2 may be electrically connected to the third alignment electrode ALE3 of the first pixel PXL1 and the first alignment electrode ALE1 of the second pixel PXL2. In an example, the same alignment signals as an alignment signal supplied to adjacent alignment electrodes may be supplied to the dummy electrode DME2. For example, the same alignment signal as an alignment signal supplied to the third alignment electrode ALE3 of the first pixel PXL1 and to the first alignment electrode ALE1 of the second pixel PXL2 may be supplied to the dummy electrode DME2 (e.g., so that an electric field can be reduced or can be prevented from being formed when different alignment signals are supplied to an area adjacent to the third alignment electrode ALE3 of the first pixel PXL1 and the first alignment electrode ALE1 of the second pixel PXL2). Accordingly, an arrangement failure of the light-emitting elements LD1 and LD2, in which the light-emitting elements LD1 and LD2 are located biased toward any one side due to an electro-osmosis phenomenon caused by the formation of an electric field, can be reduced or minimized.

In one or more embodiments, the first and second light-emitting elements LD1 and LD2 may be located on the first insulating layer INS1. The first light-emitting element LD1 may overlap with a portion of the first alignment electrode ALE1 and a portion of the second alignment electrode ALE2. The second light-emitting element LD2 may overlap with a portion of the second alignment electrode ALE2 and a portion of the third alignment electrode ALE3.

In one or more embodiments, a second insulating layer INS2 may be located on each of the first and second light-emitting elements LD1 and LD2. The second insulating layer INS2 may cover an active layer (e.g., the active layer 12 shown in FIG. 1) of each of the first and second light-emitting elements LD1 and LD2. Also, the second insulating layer INS2 may reduce or prevent the likelihood of a short circuit between adjacent electrodes (e.g., the first pixel electrode PE1 and the connection electrode CNE). The second insulating layer INS2 may include an organic material or an inorganic material.

In one or more embodiments, the first pixel electrode PE1 may be in contact with a first end portion of the first light-emitting element LD1, and may be located on the first insulating layer INS1 and the second insulating layer INS2. The first pixel electrode PE1 may be an anode electrode electrically connected to the first transistor T1.

In one or more embodiments, the second pixel electrode PE2 may be located on the first insulating layer INS1 and the second insulating layer INS2, and may be in contact with a second end portion of the second light-emitting element LD2. The second pixel electrode PE2 may be a cathode electrode electrically connected to the second power line PL2.

In one or more embodiments, a third insulating layer INS3 may be located over the first pixel electrode PE1 and the second pixel electrode PE2, and may be located between the first pixel electrode PE1 and the connection electrode CNE and between the connection electrode CNE and the second pixel electrode PE2. The third insulating layer INS3 may reduce or prevent the likelihood of an electrical short circuit between the first pixel electrode PE1 and the connection electrode CNE and an electrical short circuit between the connection electrode CNE and the second pixel electrode PE2.

In one or more embodiments, the third insulating layer INS3 may include one material among silicon oxide ($SiO_x$), silicon nitride ($SiN_x$), silicon oxynitride ($SiO_xN_y$), aluminum oxide ($AlO_x$), and titanium oxide ($TiO_x$).

In one or more embodiments, the connection electrode CNE may be in contact with a second end portion of the first light-emitting element LD1 and with a first end portion of the second light-emitting element LD2, and may be located on the first insulating layer INS1 and the second insulating layer INS2. For example, the first light-emitting element LD1 and the second light-emitting element LD2 may be connected in series by the connection electrode CNE.

In one or more embodiments, the connection electrode CNE may be located on the first to third insulating layers INS1 to INS3, and may be in contact with the second end portion of the first light-emitting element LD1 and the second end portion of the second light-emitting element LD2. For example, the first light-emitting element LD1 and the second light-emitting element LD2 may be connected in series by the connection electrode CNE.

In one or more embodiments, the first pixel electrode PE1, the second pixel electrode PE2, and the connection electrode CNE may include a conductive material. For example, the first pixel electrode PE1, the second pixel electrode PE2, and the connection electrode CNE may include a transparent conductive material including one of Indium Tin Oxide (ITO), Indium Zinc Oxide (IZO), and Indium Tin Zinc Oxide (ITZO). However, the present disclosure is not necessarily limited to the above-described example.

In one or more embodiments, a fourth insulating layer INS4 may be located over the third insulating layer INS3, and may cover the connection electrode CNE and the second pixel electrode PE2. The fourth insulating layer INS4 may protect lower components of the display element layer DPL.

In one or more embodiments, the fourth insulating layer INS4 may include one material among silicon oxide ($SiO_x$), silicon nitride ($SiN_x$), silicon oxynitride ($SiO_xN_y$), aluminum oxide ($AlO_x$), and titanium oxide ($TiO_x$).

In one or more embodiments, the color conversion layer CCL may be located on the fourth insulating layer INS4. The color conversion layer CCL may allow a wavelength of light provided from the light-emitting elements LD1 and LD2 to be changed or transmitted therethrough. In one or more embodiments, the light-emitting elements LD1 and LD2 may emit blue light.

For example, when the first pixel PXL1 is a red pixel, a wavelength conversion pattern WCP of the color conversion layer CCL may include first color conversion particles (e.g., a quantum dot) for converting blue light into red light. The first color conversion particle may absorb blue light and may emit red light by shifting a wavelength of the blue light according to energy transition.

In one or more embodiments, when the first pixel PXL1 is a green pixel, the wavelength conversion pattern WCP of the color conversion layer CCL may include second color conversion particles (e.g., a quantum dot) for converting blue light into green light. The second color conversion particle may absorb blue light and may emit green light by shifting a wavelength of the blue light according to energy transition.

In one or more embodiments, the color conversion particles may have a shape, such as a spherical shape, a pyramid shape, a multi-arm shape, a cubic nano particle, a nano wire, a nano fabric, or a nano plate particle. However, the present disclosure is not limited thereto.

In one or more embodiments, when the first pixel PXL1 is a blue pixel, the color conversion layer CCL may include a light transmission pattern instead of the wavelength conversion pattern WCP. The light transmission pattern is used to efficiently use light emitted from the light-emitting elements LD1 and LD2, and may include a plurality of light scattering particles dispersed in a matrix material (e.g., predetermined matrix material), such as base resin. For example, the light transmission pattern may include light scattering particles, such as silica, but the material constituting the light scattering particles is not limited thereto.

In one or more embodiments, the optical layer OPL may be located on the display element layer DPL. In accordance with one or more embodiments, the optical layer OPL may include a first capping layer CAP1, a low refractive layer LRL, and a second capping layer CAP2.

In one or more embodiments, the first capping layer CAP1 may seal (or cover) the color conversion layer CCL. The first capping layer CAP1 may be located between the low refractive layer LRL and the display element layer DPL. The first capping layer CAP1 may reduce or prevent the likelihood of infiltration of an impurity, such as moisture or air from the outside. For example, the first capping layer CAP1 may include one of silicon oxide ($SiO_x$), silicon nitride ($SiN_x$), silicon oxynitride ($SiO_xN_y$), and aluminum oxide ($AlO_x$).

In one or more embodiments, the low refractive layer LRL may be located between the first capping layer CAP1 and the second capping layer CAP2. The low refractive layer LRL may recycle light provided from the color conversion layer CCL, thereby improving light efficiency. To this end, the low refractive layer LRL may have a refractive index lower than a refractive index of the color conversion layer CCL. In one or more embodiments, the low refractive layer LRL may include a base resin and hollow particles dispersed in the base resin. The hollow particle may include a hollow silica particle. Alternatively, the hollow particle may be a pore formed by porogen, but the present disclosure is not necessarily limited thereto. Also, the low refractive layer LRL may include one of a zinc oxide ($ZnO_x$) particle, a titanium dioxide ($TiO_x$) particle, and a nano silicate particle, but the present disclosure is not necessarily limited thereto.

In one or more embodiments, the second capping layer CAP2 may be located on the low refractive layer LRL. The second capping layer CAP2 may reduce or prevent the likelihood of infiltration of an impurity, such as moisture or air from the outside. The second capping layer CAP2 may include one of silicon nitride ($SiN_x$), silicon oxide ($SiO_x$), silicon oxynitride ($SiO_xN_y$), and aluminum oxide ($AlO_x$).

In one or more embodiments, the color filter layer CFL may be located on the second capping layer CAP2. The color filter layer CFL may include color filters CF1, CF2, and CF3, and an overcoat layer OC.

In one or more embodiments, a first color filter CF1 may be located throughout the first emission area EMA1 and the non-emission area NEA, corresponding to a color of the first pixel PXL1. The first color filter CF1 allows light of the color of the first pixel PXL1 to be transmitted therethrough, and allows light of colors of the second and third pixels PXL2 and PXL3 to be blocked.

In one or more embodiments, the first color filter CF1, a second color filter CF2, and a third color filter CF3 may be sequentially stacked in the non-emission area NEA.

In one or more embodiments, the overcoat layer OC may be located over color filters CF. The overcoat layer OC may reduce or prevent the likelihood of moisture or air infiltrating into a lower member. Also, the overcoat layer OC may protect the above-described lower member from a foreign matter, such as dust. In an example, the overcoat layer OC may include an organic material, such as acryl resin, epoxy resin, phenolic resin, polyamide resin, polyimide resin, unsaturated polyester resin, poly-phenylene ether resin, poly-phenylene sulfide resin, or benzocyclobutene (BCB). However, the present disclosure is not necessarily limited to the above-described example.

Figure 9A:
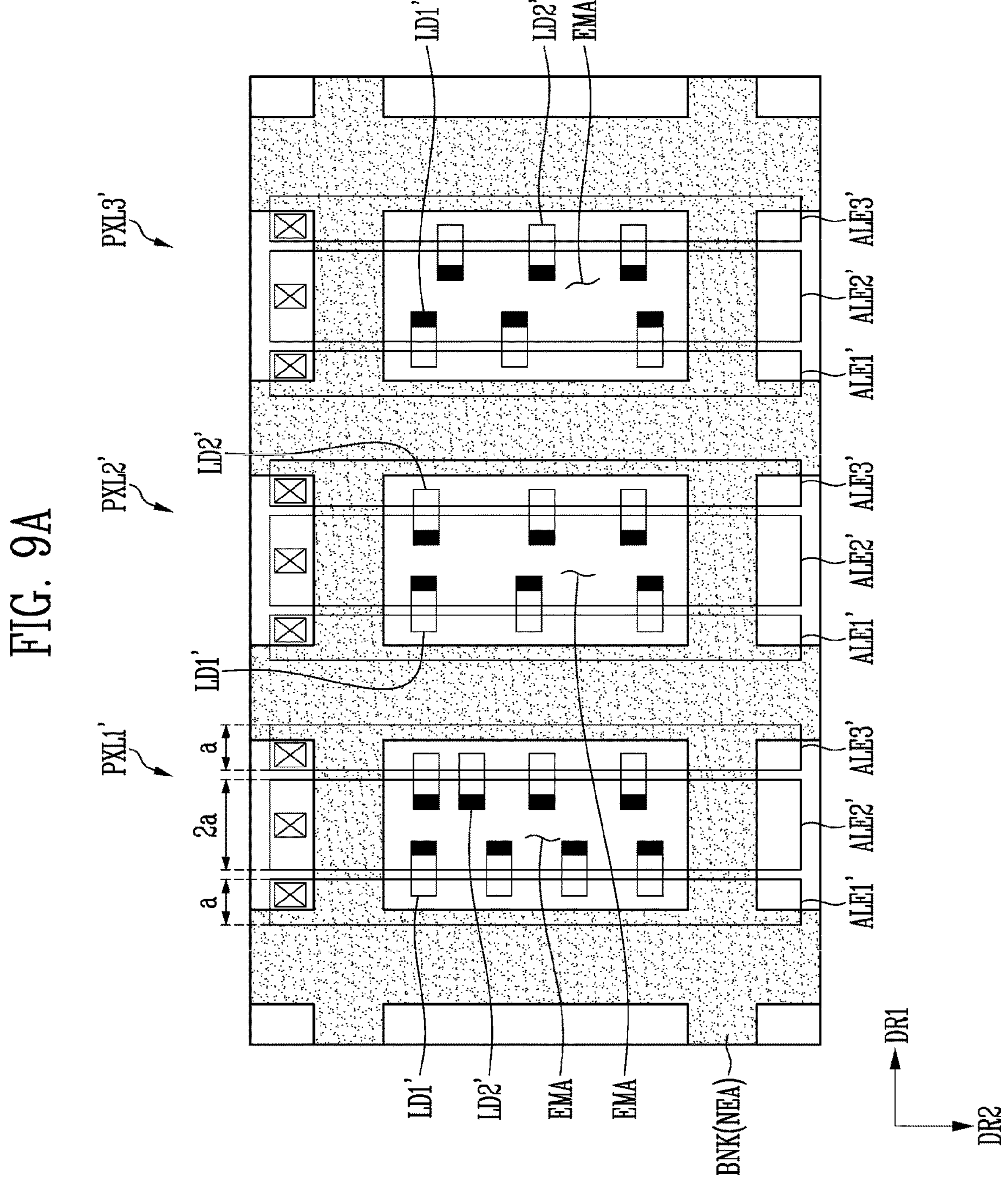
FIGS. 9A and 9B illustrate a comparative example of alignment electrodes.
Figure 9B:
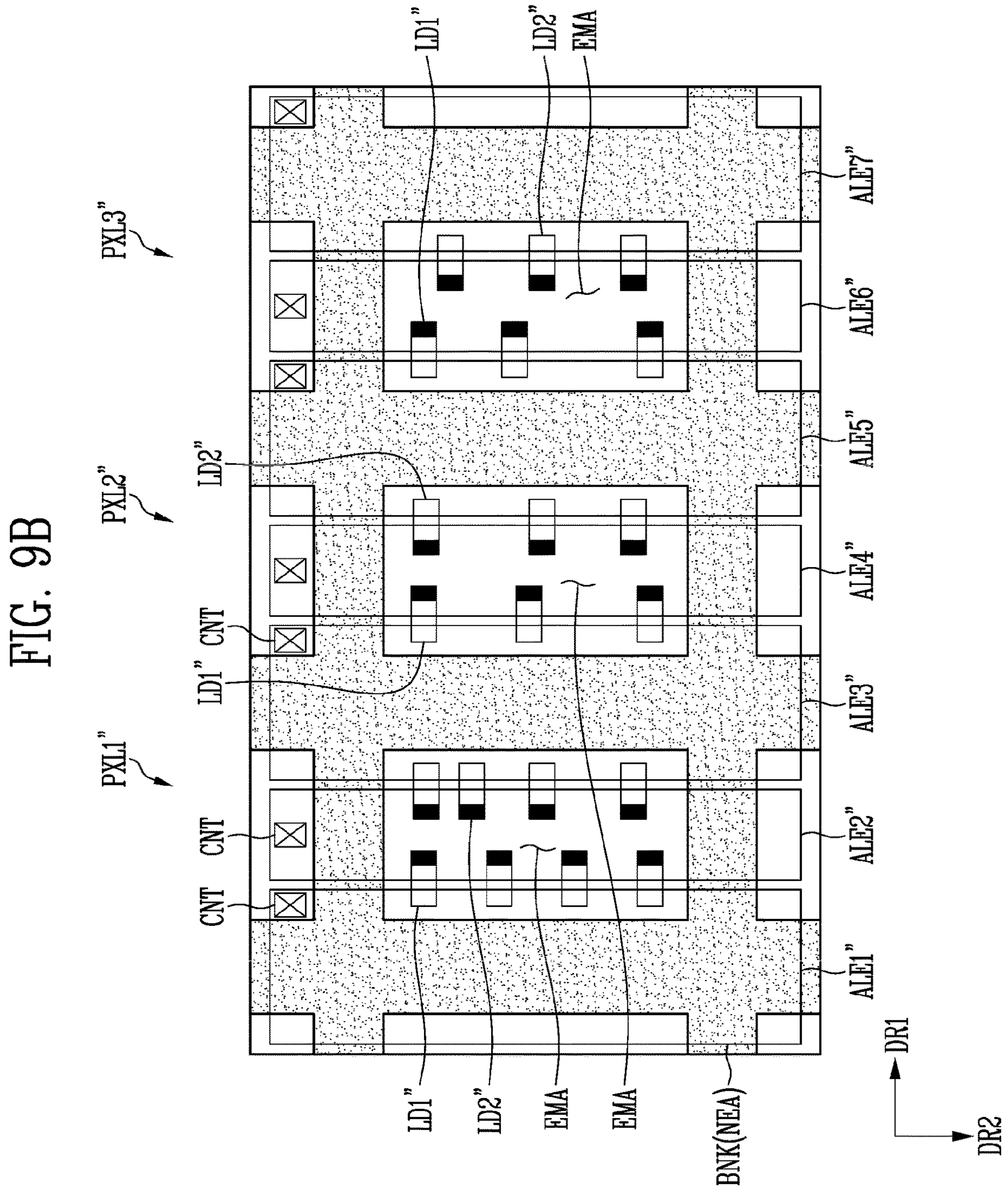

FIGS. 9A and 9B illustrate a comparative example of alignment electrodes.

In FIG. 9A, a first alignment electrode ALE1', a second alignment electrode ALE2', and a third alignment electrode ALE3' may be arranged in the first direction DR1 in an emission area EMA of a first pixel PXL1', a first alignment electrode ALE1', a second alignment electrode ALE2', and a third alignment electrode ALE3' may be arranged in the first direction DR1 in an emission area EMA of a second pixel PXL2', and a first alignment electrode ALE1', a second alignment electrode ALE2', and a third alignment electrode ALE3' may be arranged in the first direction DR1 in an emission area EMA of a third pixel PXL3'.

In FIG. 9B, a first alignment electrode ALE1", a second alignment electrode ALE2", and a third alignment electrode ALE3" may be arranged in the first direction DR1 in an emission area EMA of a first pixel PXL1", the third alignment electrode ALE3", a fourth alignment electrode ALE4", and a fifth alignment electrode ALE5" may be arranged in the first direction DR1 in an emission area EMA of a second pixel PXL2", and the fifth alignment electrode ALE5", a sixth alignment electrode ALE6", and a seventh alignment electrode ALE7" may be arranged in the first direction DR1 in an emission area EMA of a third pixel PXL3". In other words, the first pixel PXL1" and the second pixel PXL2" may share the third alignment electrode ALE3", and the second pixel PXL2" and the third pixel PXL3" may share the fifth alignment electrode ALE5".

Referring to FIG. 9A, when each of widths of the first and third alignment electrodes ALE1' and ALE3' is a first size (e.g., first width) "a," a width of the second alignment electrode ALE2' may be a second size (e.g., second width) "2a" that is twice that of the first size a. In an example, the third alignment electrode ALE3' of the first pixel PXL1' and the first alignment electrode ALE1' of the second pixel PXL2' may be spaced apart from each other at a certain distance.

Referring to FIGS. 6A, 6B, and 9A, a number of lights that are reflected from the first to third alignment electrodes ALE1, ALE2, and ALE3 and the dummy electrode DME1 (or DME2), and then emitted to the first emission area EMA, among lights emitted from the first and second light-emitting elements LD1 and LD2 located on the first emission area EMA of the first pixel PXL1 is greater than a number of lights that are reflected from the first to third alignment electrodes ALE1', ALE2', and ALE3', and then emitted to the emission area EMA, among lights emitted from first and second light-emitting elements LD1' and LD2' located on the emission area EMA of the first pixel PXL1'. That is, light efficiency of the first pixel PXL1 shown in FIGS. 6A and 6B is more excellent than light efficiency of the first pixel PXL1' shown in FIG. 9A.

Referring to FIG. 9B, the third and fifth alignment electrodes ALE3" and ALE5" may be formed to be shared with respective adjacent pixels. In an example, a width of each of the third and fifth alignment electrodes ALE3" and ALE5" may be greater than a width of the second alignment electrode ALE2". For example, the width of each of the third and fifth alignment electrodes ALE3" and ALE5" may be twice the width of the second alignment electrode ALE2".

Referring to FIG. 9B, the first and third alignment electrodes ALE1" and ALE3" of the first pixel PXL1" are shared with respective adjacent pixels, and a sectional area of each of the first and third alignment electrodes ALE1" and ALE3" of the first pixel PXL1" is wider than a sectional area of the second alignment electrode ALE2". That is, in a process in which first and second light-emitting elements LD1" and LD2" are located in the first pixel PXL1", the first and third alignment electrodes ALE1" and ALE3" are relatively wide, and hence the light-emitting elements LD1" and LD2" may be located biased toward any one side due to an electro-osmosis phenomenon. Therefore, an arrangement failure degree of the light-emitting elements LD1" and LD2" may increase.

Referring to FIGS. 6A, 6B, and 9B, the light-emitting elements LD1 and LD2 located in the first pixel PXL1 can be arranged more uniformly than the first and second light-emitting elements LD1" and LD2" located in the first pixel PXL1".

Figure 10:
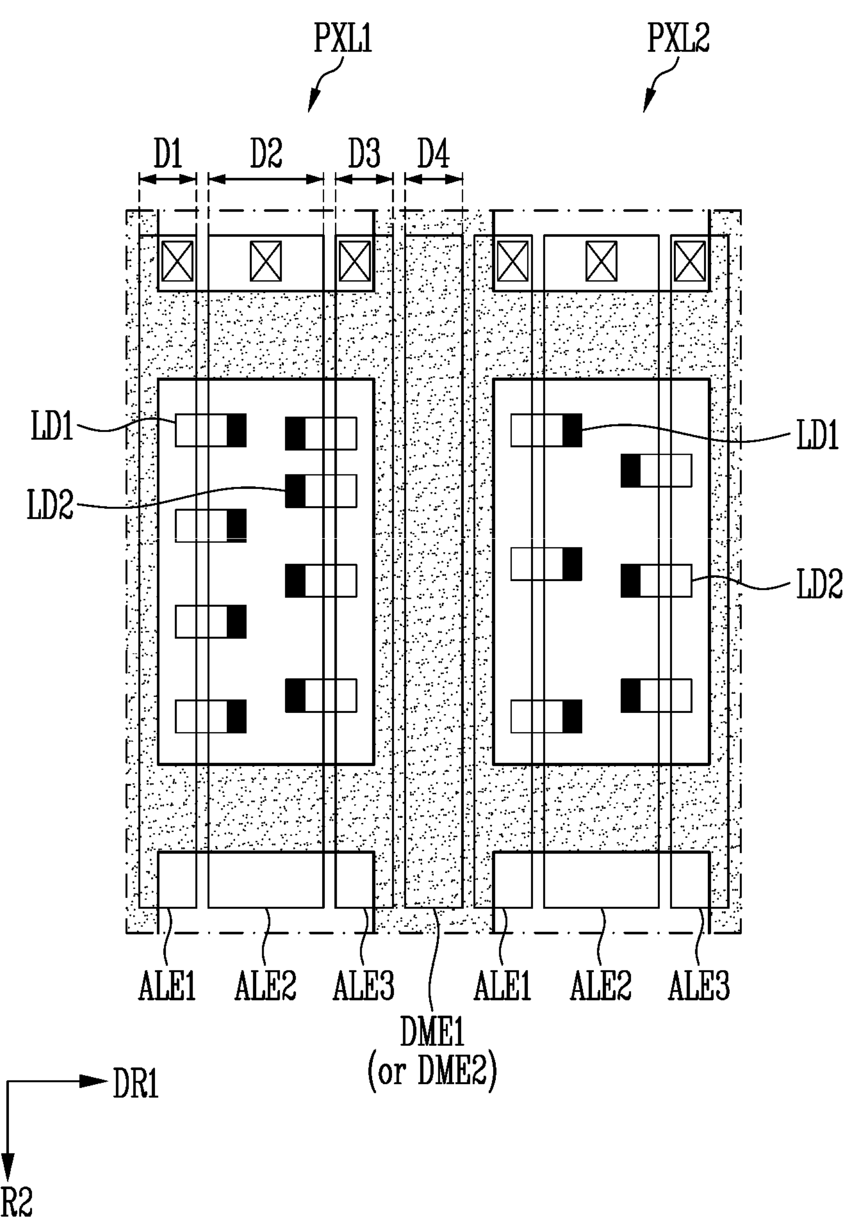
FIG. 10 is an enlarged view illustrating an example of alignment electrodes and a dummy electrode, which are included in the pixels shown in FIGS. 6A and 6B.

FIG. 10 is an enlarged view illustrating an example of the alignment electrodes and the dummy electrode, which are included in the pixels shown in FIGS. 6A and 6B.

FIG. 10 is an enlarged view of area A shown in FIGS. 6A and 6B.

Referring to FIG. 10, the first to third alignment electrodes ALE1 to ALE3 and the dummy electrode DME1 (or DME2) may be arranged in the first direction DR1.

In one or more embodiments, a magnitude D1 of the width of the first alignment electrode ALE1 in the first direction DR1 may be equal to a magnitude D3 of the width of the third alignment electrode ALE3 in the first direction DR1. In an example, a magnitude D2 of the width of the second alignment electrode ALE2 in the first direction DR1 may be formed such that the second end portion of the first light-emitting element LD1 and the second end portion of the second light-emitting element LD2 can be suitably located. The magnitude D2 of the width of the second alignment electrode ALE2 may be greater than each of the magnitudes D1 and D3 of the respective widths of the first alignment electrode ALE1 and the third alignment electrode ALE3. In an example, the magnitude D2 of the width of the second alignment electrode ALE2 may be twice that of each of the magnitudes D1 and D3 of the widths of the first alignment electrode ALE1 and the third alignment electrode ALE3. For example, each of the magnitudes D1 and D3 of the widths of the first alignment electrode ALE1 and the third alignment electrode ALE3 may be about 7.75 μm, and the magnitude D2 of the width of the second alignment electrode ALE2 may be about 15 μm.

In one or more embodiments, the dummy electrode DME1 (or DME2) may be located in the first direction DR1 of the third alignment electrode ALE3. A distance between the dummy electrode DME1 (or DME2) and the third alignment electrode ALE3 may be substantially equal to a distance between the first alignment electrode ALE1 and the second alignment electrode ALE2 and to a distance between the second alignment electrode ALE2 and the third alignment electrode ALE3.

In one or more embodiments, a magnitude D4 of the width of the dummy electrode DME1 (or DME2) in the first direction DR1 may be determined according to a size of a display device (e.g., the display device DD shown in FIG. 3). As the size of the display device becomes larger, the magnitude D4 of the width of the dummy electrode DME1 (or DME2) may become larger.

In one or more embodiments, in the alignment process of the light-emitting elements LD1 and LD2, a first alignment signal may be supplied to the first and third alignment electrodes ALE1 and ALE3, and a second alignment signal may be supplied to the second alignment electrode ALE2. For example, one of the first alignment signal and the second alignment signal may be an AC signal, and the other of the first alignment signal and the second alignment signal may be a ground signal. In an example, the same alignment signal as an alignment signal supplied to the first and third alignment electrodes ALE1 and ALE3 may be supplied to the dummy electrode DME2 in the alignment process. As the dummy electrode DME2 is spaced apart from the third alignment electrode ALE3 of the first pixel PXL1 and the first alignment electrode ALE1 of the second pixel PXL2, and the same alignment signal as an alignment signal supplied to the first and third alignment electrodes ALE1 and ALE3 is supplied to the dummy electrode DME2 in the alignment process, the likelihood of arrangement failure of the first and second light-emitting elements LD1 and LD2 can be reduced or prevented, and the light emission efficiency of light that is emitted from the first and second light-emitting elements LD1 and LD2 and then reflected can be relatively improved.

FIGS. 11, 12, 13A, 13B, 14A, 14B, 15A, and 15B are schematic plan views illustrating a method of manufacturing the display device in accordance with embodiments of the present disclosure.

Figure 14A:
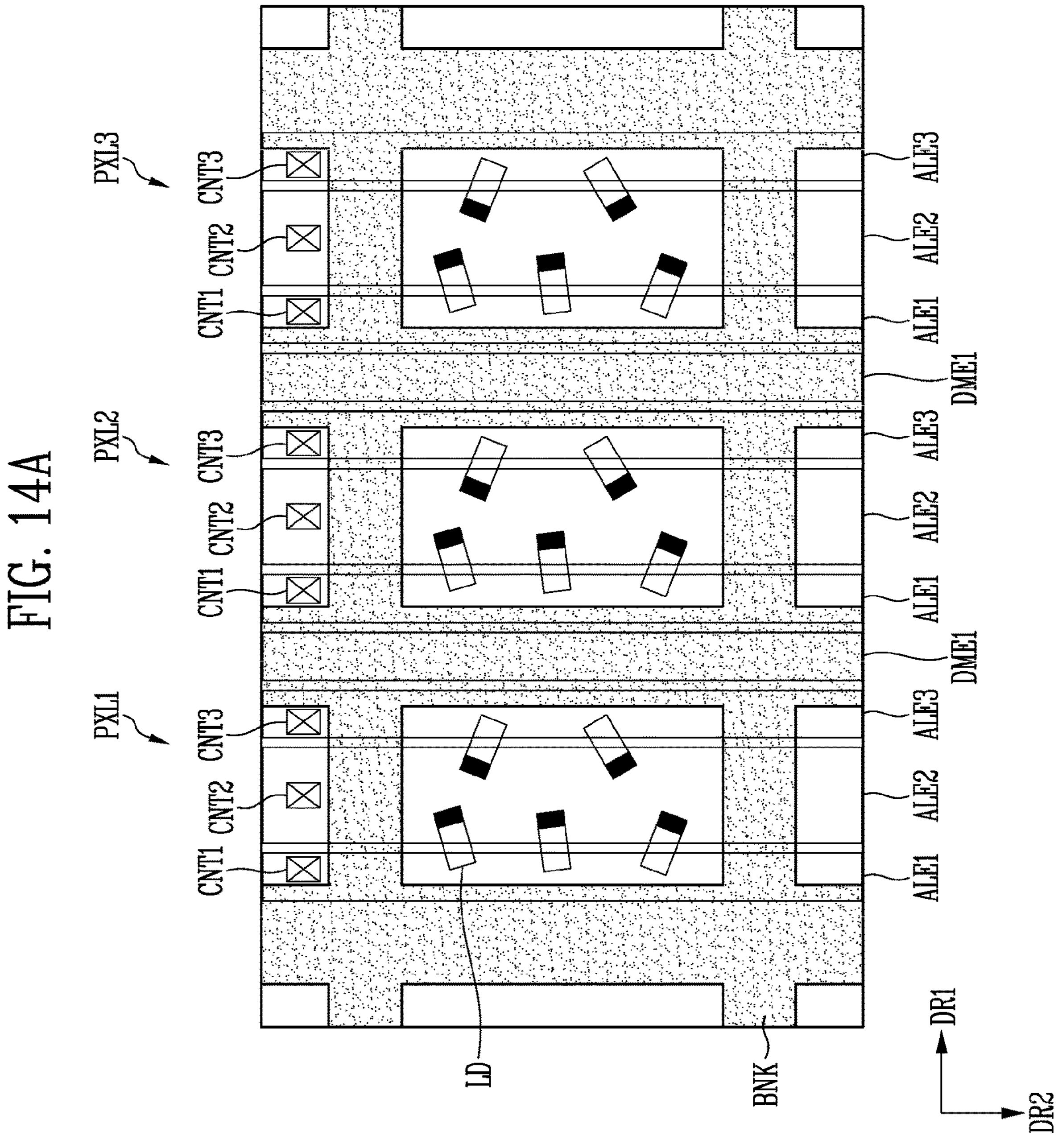
Figure 14B:
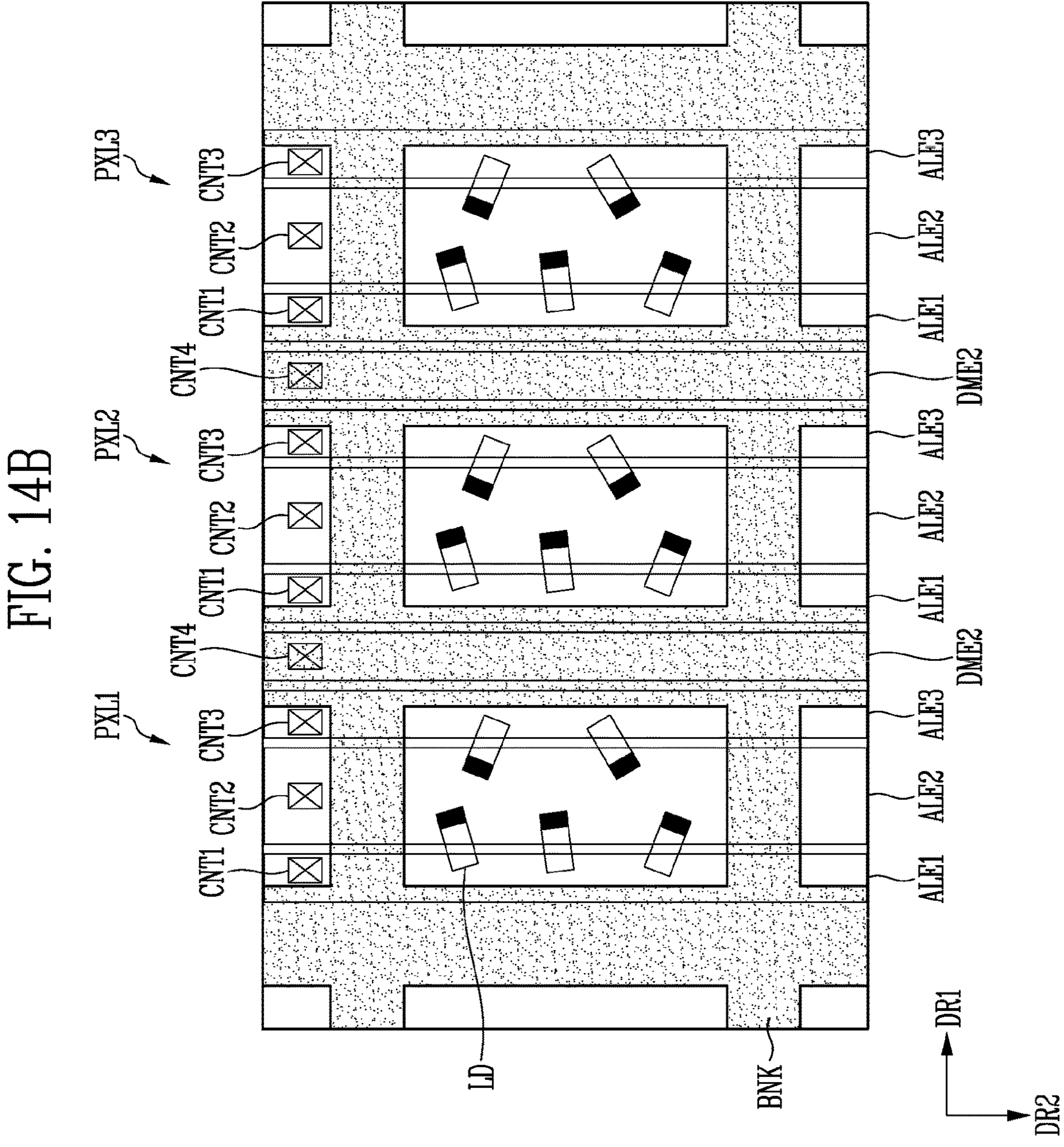
Figure 15A:
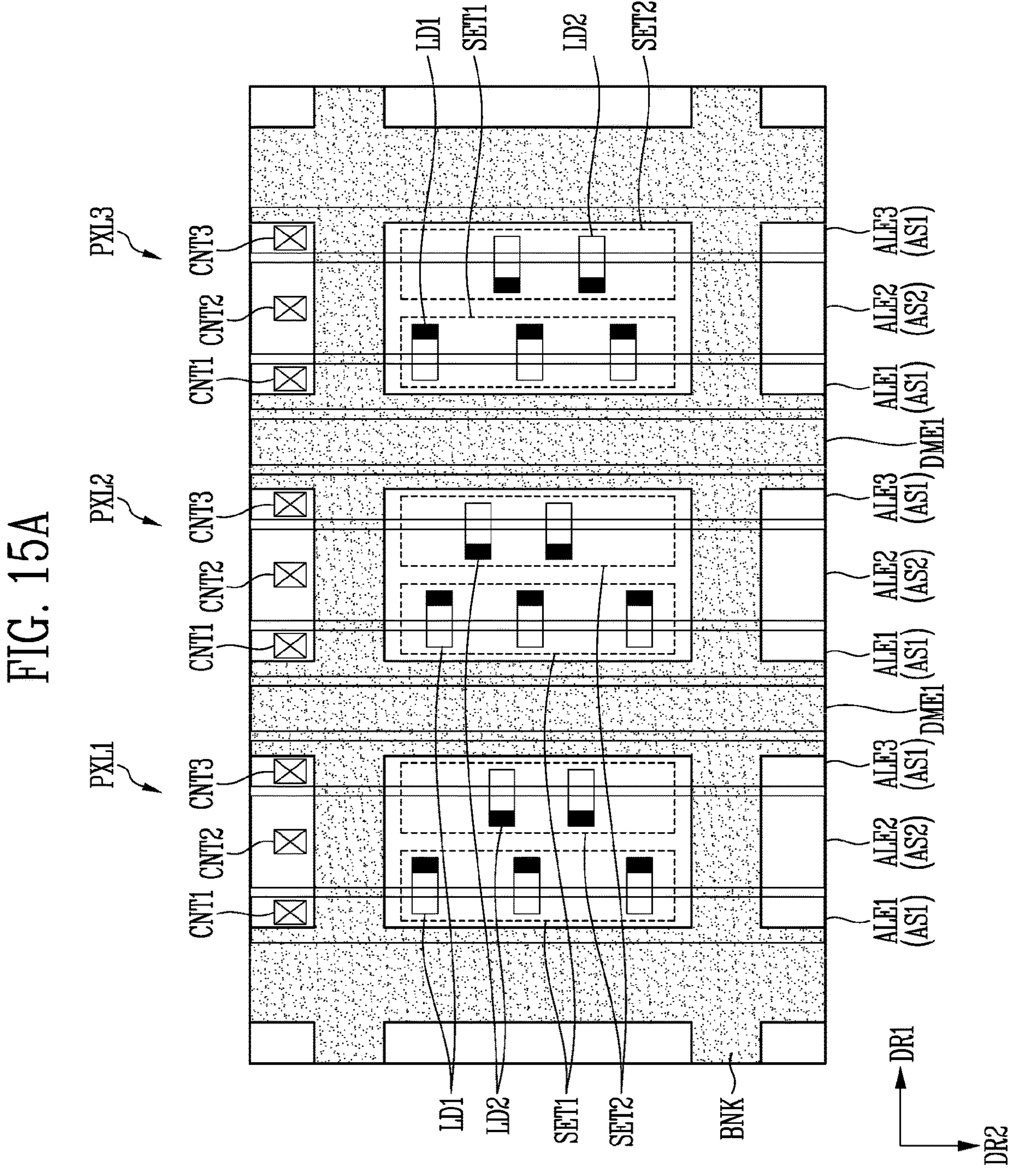
Figure 15B:
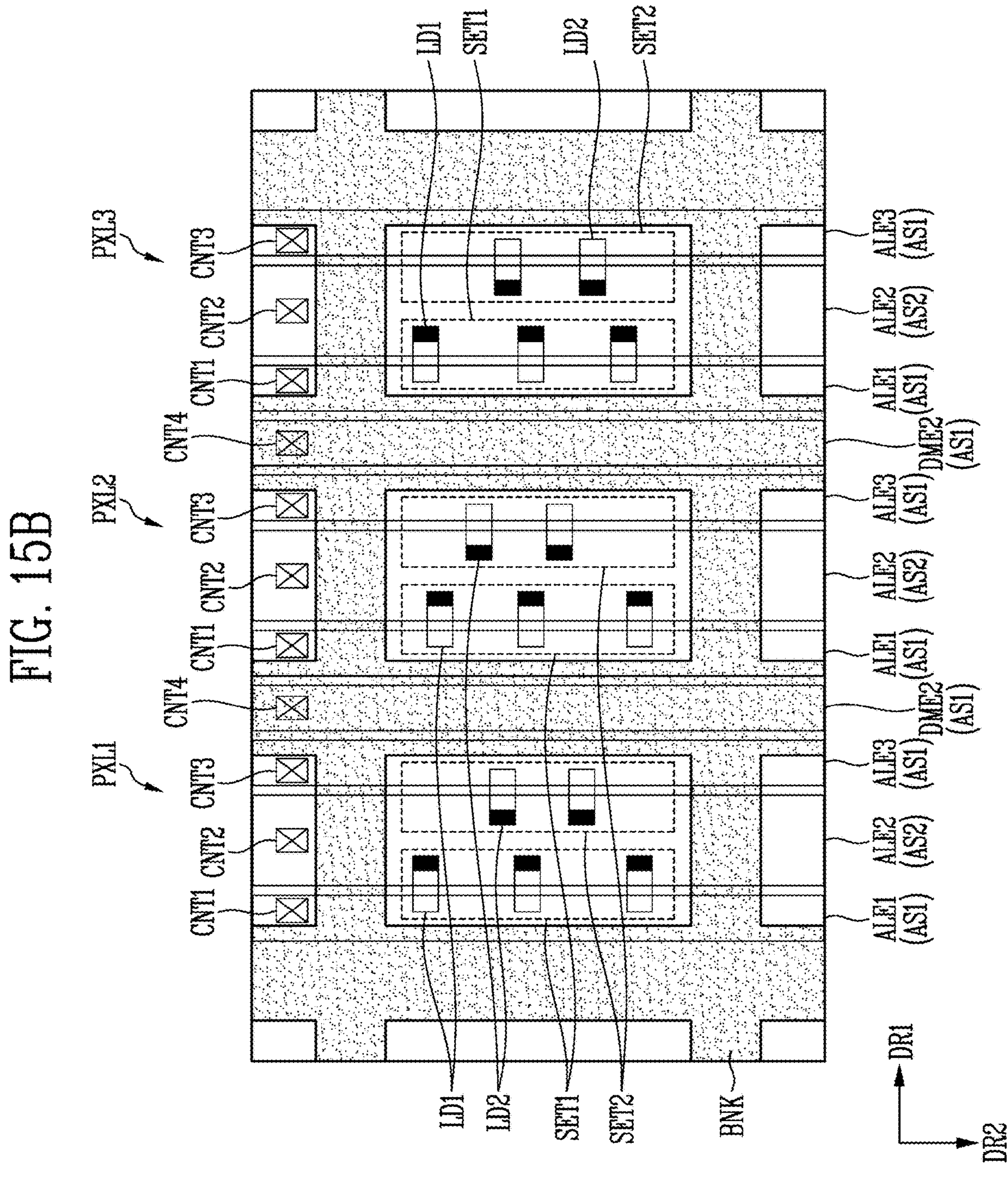

Referring to FIGS. 11, 12, 13A, 13B, 14A, 14B, 15A, and 15B, the method may include forming, on a substrate SUB, first to third alignment electrodes ALE1 to ALE3 arranged while being spaced apart from each other in the first direction DR1 (see FIG. 11), forming a bank BNK defining first to third emission areas EMA1, EMA2, and EMA3 on the first to third alignment electrodes ALE1 to ALE3 (see FIG. 12), forming a dummy electrode DME1 (see FIG. 13A) or forming a dummy electrode DME2 (see FIG. 13B) such that the dummy electrode DME1 or the dummy electrode DME2 is located between the first to third emission areas EMA1, EMA2, and EMA3 to overlap with the bank when viewed on a plane, providing light-emitting elements LD in the first to third emission areas EMA1, EMA2, and EMA3 (see FIGS. 14A and 14B), and arranging the light-emitting elements LD by using an alignment signal (see FIGS. 15A and 15B).

Figure 11:
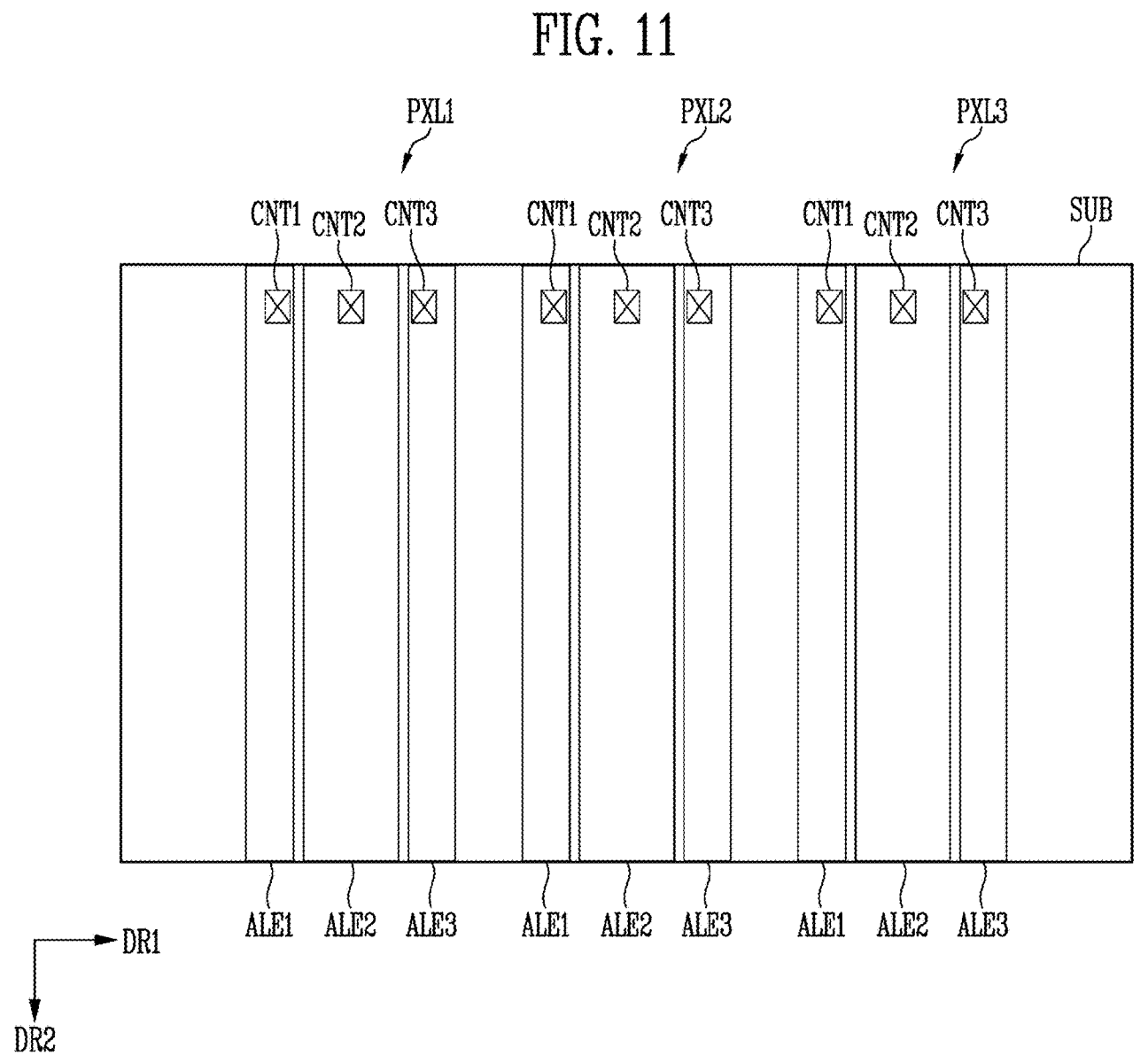

As shown in FIG. 11, first to third alignment electrodes ALE1 to ALE3 may be formed on a substrate SUB. For example, the first to third alignment electrodes ALE1 to ALE3 may be formed by patterning a conductive material, using a mask. Each of the first to third alignment electrodes ALE1 to ALE3 may be connected to a signal line to which a corresponding alignment signal is transferred through a corresponding contact hole among contact holes CNT1 to CNT3.

As shown in FIG. 12, a bank BNK may be formed, which defines a first emission area EMA1 of a first pixel PXL1, a second emission area EMA2 of a second pixel PXL2, and a third emission area EMA3 of a third pixel PXL. The bank BNK may be formed by patterning an organic material including a light-blocking material, using a mask.

In one or more embodiments, first to third contact holes CNT1, CNT2, and CNT3 formed in the first to third alignment electrodes ALE1, ALE2, and ALE3 might not overlap with the bank BNK when viewed on a plane.

As shown in FIGS. 13A and 13B, a dummy electrode DME1 (or a dummy electrode DME2) may be located between the first emission area EMA1 and the second emission area EMA2 on the bank BNK to overlap with the bank BNK. The dummy electrode DME1 (or the dummy electrode DME2) may be formed by patterning various transparent conductive materials by using a mask such that light emitted from each of light-emitting elements LD1 and LD2 (to be located subsequently) advances in an image display direction of the display device DD (e.g., the third direction DR3) without any loss.

As shown in FIG. 13B, the dummy electrode DME2 may be connected to a signal line to which the same alignment signal as an alignment signal supplied to the first and third alignment electrodes ALE1 and ALE3 is transferred through a fourth contact hole CNT4.

As shown in FIGS. 14A and 14B, light-emitting elements LD may be provided in the first emission area EMA1 and the second emission area EMA2. In one or more embodiments, an ink containing a volatile solvent, which contains the light-emitting elements LD, may be input to the first emission area EMA1 and the second emission area EMA2, which are spaces defined by the bank BNK. The light-emitting elements LD may be input through an inkjet printing process, a slit coating process, or other various processes.

As shown in FIG. 15A, a first alignment signal AS1 may be applied to the first alignment electrode ALE1 and the third alignment electrode ALE3, and a second alignment electrode AS2 may be applied to the second alignment electrode ALE2. Accordingly, the light-emitting elements LD may be arranged as first light-emitting elements LD1 of a first serial stage SET1, and as second light-emitting elements LD2 of a second serial stage SET2. The dummy electrode DME1 may have an island shape (e.g., a floating state). In an example, the dummy electrode DME1 may be a floating electrode. The dummy electrode DME1 may not be connected to other conductive layers (or conductive patterns) in an alignment process, and any electrical signal may not be provided to the dummy electrode DME1.

As shown in FIG. 15B, the first alignment signal AS1 may be applied to the first alignment electrode ALE1, the third alignment electrode ALE3, and the dummy electrode DME2, and the second alignment electrode AS2 may be applied to the second alignment electrode ALE2. Accordingly, the light-emitting elements LD may be arranged as the first light-emitting elements LD1 of the first serial stage SET1, and as the second light-emitting elements LD2 of the second serial stage SET2.

In one or more embodiments, after the first and second light-emitting elements LD1 and LD2 are aligned, the solvent may be volatilized or be removed through other processes.

As described above, in the display device, the dummy electrode DME1 (or DME2) is located between the third alignment electrode ALE3 of the first pixel PXL1 and the first alignment electrode ALE1 of the second pixel PXL2. In the display device and the method of manufacturing the same in accordance with the embodiments of the present disclosure, the dummy electrode DME1 (or DME2) overlaps with the bank BNK, and is located between the first emission area EMA1 of the first pixel PXL1 and the second emission area EMA2 of the second pixel PXL2. Thus, an electric field formed on the top of the bank BNK can be removed or reduced in the alignment process of the light-emitting elements. Accordingly, the arrangement failure in which the light-emitting elements LD1 and LD2 are located biased toward any one side in the arrangement of the light-emitting elements LD1 and LD2 forming the first and second serial stages can be reduced or minimized.

In the display device and the method of manufacturing the same in accordance with the present disclosure, a dummy electrode is located at a portion overlapping with a bank between an emission area of a first pixel and an emission area of a second pixel, so that there may be little to no electric field generated on the top of the bank in an alignment process of the light-emitting elements. Accordingly, an arrangement failure in which the light-emitting elements are biased toward any one side in arrangement of the light-emitting elements forming first and second serial stages can be reduced or minimized.

Embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims, with functional equivalents thereof to be included therein.

What is claimed is:

1. A display device comprising:

a display area comprising a first pixel, a second pixel, and a bank;

the first pixel comprising a first emission area;

the second pixel comprising a second emission area spaced apart from the first emission area in a first direction; and the bank partitioning the first emission area and the second emission area, wherein the first pixel comprises:

a first alignment electrode, a second alignment electrode, and a third alignment electrode sequentially located, spaced apart from each other in the first direction, and overlapping with the first emission area;

first light-emitting elements above, and overlapping with, the first alignment electrode and the second alignment electrode;

second light-emitting elements above, and overlapping with, the second alignment electrode and the third alignment electrode; and a dummy electrode between the first emission area and the second emission area, and overlapping with the bank in the display area.

2. The display device of claim 1, wherein the first alignment electrode and the third alignment electrode are configured to provide a first alignment signal while the second alignment electrode is configured to provide a second alignment signal that is different from the first alignment signal.

3. The display device of claim 2, wherein, the dummy electrode is configured to provide the first alignment signal.

4. The display device of claim 2, wherein the second pixel comprises:

a fourth alignment electrode, a fifth alignment electrode, and a sixth alignment electrode sequentially located, spaced apart from each other in the first direction, and overlapping with the second emission area;

third light-emitting elements above, and overlapping with, the fourth alignment electrode and the fifth alignment electrode; and fourth light-emitting elements above, and overlapping with, the fifth alignment electrode and the sixth alignment electrode.

5. The display device of claim 4, wherein the dummy electrode is between the third alignment electrode of the first pixel and the fourth alignment electrode of the second pixel.

6. The display device of claim 4, wherein the fourth alignment electrode and the sixth alignment electrode are configured to provide the first alignment signal while the fifth alignment electrode is configured to provide the second alignment signal.

7. The display device of claim 1, wherein the dummy electrode comprises a floating electrode.

8. The display device of claim 1, wherein a planar shape of the first alignment electrode is substantially the same as a planar shape of the third alignment electrode.

9. The display device of claim 8, wherein a width of each of the first alignment electrode and the third alignment electrode in the first direction is less than a width of the second alignment electrode in the first direction.

10. The display device of claim 9, wherein the width of the second alignment electrode in the first direction is twice the width of each of the first alignment electrode and the third alignment electrode in the first direction.

11. The display device of claim 1, wherein the dummy electrode is above the bank.

12. The display device of claim 1, wherein the dummy electrode is spaced from the first alignment electrode, the second alignment electrode, and the third alignment electrode in plan view.

13. The display device of claim 1, further comprising a first pixel electrode, a connection electrode, and a second pixel electrode sequentially arranged, spaced apart from each other in the first direction, and provided in each of the first emission area and the second emission area.

14. The display device of claim 1, wherein the first alignment electrode, the second alignment electrode, and the third alignment electrode comprise a bar-like shape.

15. The display device of claim 1, wherein the dummy electrode is spaced from the first emission area and the second emission area in plan view.

16. A method of manufacturing a display device comprising a display area, the method comprising:

forming, above a substrate, a first alignment electrode, a second alignment electrode, and a third alignment electrode spaced apart from each other in a first direction;

forming, above the first alignment electrode, the second alignment electrode, and the third alignment electrode, a bank defining a first emission area, and a second emission area spaced apart from the first emission area in the first direction;

forming a dummy electrode between the first emission area and the second emission area, which are disposed within the display area, to overlap with the bank;

providing light-emitting elements in the first emission area and the second emission area; and arranging the light-emitting elements by applying a first alignment signal to the first alignment electrode and to the third alignment electrode, and by applying a second alignment signal to the second alignment electrode.

17. The method of claim 16, wherein, in the arranging of the light-emitting elements, the first alignment signal is applied to the dummy electrode.

18. The method of claim 16, wherein the dummy electrode comprises a floating electrode.

19. The method of claim 16, wherein a planar shape of the first alignment electrode is substantially the same as a planar shape of the second alignment electrode, and wherein a width of each of the first alignment electrode and the third alignment electrode in the first direction is less than a width of the second alignment electrode in the first direction.

20. The method of claim 19, wherein the width of the second alignment electrode in the first direction is twice the width of each of the first alignment electrode and the third alignment electrode.

* * * * *